(12) United States Patent
Pugliese, Jr. et al.

(10) Patent No.: US 12,710,341 B2
(45) Date of Patent: Aug. 18, 2026

(54) DEW POINT SENSING IN SEMICONDUCTOR PROCESSING SYSTEM LOAD LOCKS

(71) Applicant: ASM IP Holding, B.V., Almere (NL)

(72) Inventors: Frank A. Pugliese, Jr., Phoenix, AZ (US); Andrew Rosser, West Midlands (GB)

(73) Assignee: ASM IP Holding B.V., Almere (NL)

( * ) Notice: Subject to any disclaimer, the term of this patent is extended or adjusted under 35 U.S.C. 154(b) by 791 days.

(21) Appl. No.: 18/065,911

(22) Filed: Dec. 14, 2022

(65) Prior Publication Data

US 2023/0194392 A1 Jun. 22, 2023

Related U.S. Application Data

(60) Provisional application No. 63/290,381, filed on Dec. 16, 2021.

(51) Int. Cl.
*G01N 1/22* (2006.01)
*G01N 25/66* (2006.01)
*H10P 72/00* (2026.01)

(52) U.S. Cl.
CPC .......... *G01N 1/2226* (2013.01); *G01N 25/66* (2013.01); *H10P 72/0466* (2026.01)

(58) Field of Classification Search
CPC .................................................. G01N 1/2226
USPC ...................................................... 73/25.04
See application file for complete search history.

(56) References Cited

U.S. PATENT DOCUMENTS

| | | | | |
|---|---|---|---|---|
| 6,701,972 | B2 | 3/2004 | Dickinson | |
| 6,750,155 | B2 | 6/2004 | Halsey | |
| 6,841,200 | B2 | 1/2005 | Kraus | |
| 10,315,181 | B2 | 6/2019 | Fahrenbruck | |
| 10,361,104 | B2 | 7/2019 | Assaf | |
| 11,515,175 | B2 | 11/2022 | Akiyama et al. | |
| 2004/0194268 | A1 | 10/2004 | Halsey | |
| 2005/0284572 | A1 | 12/2005 | Chen | |
| 2011/0291030 | A1* | 12/2011 | Lee | H01J 37/185 432/9 |
| 2012/0017973 | A1 | 1/2012 | Beck | |

(Continued)

FOREIGN PATENT DOCUMENTS

| | | |
|---|---|---|
| TW | 201906041 A | 2/2019 |

*Primary Examiner* — Walter L Lindsay, Jr.
*Assistant Examiner* — Philip T Fadul
(74) *Attorney, Agent, or Firm* — Banner & Witcoff, Ltd.

(57) ABSTRACT

A dew point sensor arrangement includes sensing and dry gas source conduits coupled to a dew point sensor. A sensing valve with a sensing valve member couples the sensing conduit to the dew point sensor. A drying valve with a drying valve member couples the dry gas source conduit to the dew point sensor. The sensing valve member fluidly separates the sensing conduit from the dew point sensor in a sensing valve member closed position, the drying valve fluidly couples the dry gas source conduit to the dew point sensor in a drying valve member open position, and the drying valve member moves to the drying valve member open position when the sensing valve member moves to the sensing valve member closed position to dry the dew point sensor using dry gas provided through the dry gas source conduit. Semiconductor processing systems and dew point sensing methods are also described.

22 Claims, 17 Drawing Sheets

(56) References Cited

U.S. PATENT DOCUMENTS

| | | | | |
|---|---|---|---|---|
| 2016/0148822 | A1* | 5/2016 | Criminale | H01L 21/67248 165/104.34 |
| 2019/0295872 | A1 | 9/2019 | Assaf | |
| 2020/0135501 | A1* | 4/2020 | Hsu | H01L 21/67253 |
| 2020/0144067 | A1 | 5/2020 | Salinas | |
| 2022/0238359 | A1* | 7/2022 | Sato | H01L 21/67766 |
| 2022/0357062 | A1* | 11/2022 | Beggs | F24F 7/007 |

* cited by examiner

DEW POINT SENSING IN SEMICONDUCTOR PROCESSING SYSTEM LOAD LOCKS

CROSS-REFERENCE TO RELATED APPLICATIONS

This application claims priority to and the benefits of U.S. Provisional Application No. 63/290,381, filed on Dec. 16, 2021, the contents of which are incorporated herein by reference in its entirety.

FIELD OF INVENTION

The present disclosure generally relates to moisture control. More particularly, the present disclosure relates to moisture control in semiconductor processing systems during the fabrication of semiconductor devices

BACKGROUND OF THE DISCLOSURE

Semiconductor devices are commonly fabricated by performing a sequence of operations, such as patterning, etch, and material layer deposition, using semiconductor processing systems adapted for the various operations. For example, patterning systems are commonly employed to impart patterns into substrates, generally using electromagnetic radiation communicated through a medium such as air or an inert gas. Etching systems are generally employed to selectively remove material from the surface of a substrate, such as from within a pattern define during a prior patterning operation. Deposition systems are typically employed to deposit material layers onto substrates, such as into recesses defined in the substrate surface during a prior etching operation or as a blanket on the substrate surface prior to patterning.

In some semiconductor processing systems, moisture may influence the operation performed by a given semiconductor processing system. For example, moisture infiltration into semiconductor processing systems employed for patterning can change the index of refraction of the atmosphere through which a pattern is transferred onto a substrate, potentially distorting the pattern and circuitry forming the resulting semiconductor device. Moisture infiltration into semiconductor processing systems employed for etching can influence the amount of material removed from a substrate during the etching process, for example, by locally increasing etch rate (and thereby recess size) at certain locations on the substrate surface, also altering features of the semiconductor device formed using the recesses. And moisture infiltration into semiconductor processing systems employed for material layer deposition may influence mechanical and/or electrical properties of material layers deposited onto the substrate, for example, by altering crystallographic structure of material layers grown using epitaxial deposition techniques.

Various countermeasures exist to limit moisture infiltration into semiconductor processing systems. For example, some semiconductor processing systems employ moisture monitoring sensors to monitor moisture content within the atmosphere of spaces located outside of evacuated spaces in the semiconductor processing system. Such moisture monitoring sensors typically provide an indication of humidity within the atmosphere of the monitored chamber, allowing moisture to be removed from the atmosphere when moisture content rises above a desired moisture level. While generally satisfactory for their intended purpose, the accuracy of such moisture monitoring sensors may be influenced by the rate of change (or slew) of moisture content within the atmosphere that the sensor is employed. For example, humidity change associated with pressure change in a space, such as due to venting or evacuation of a pump down chamber in the semiconductor processing system, can cause some moisture sensors outside of the range within which responds linearly with moisture content. As a consequence, the moisture monitoring sensors may have insufficient accuracy to control moisture within the chamber levels required for operation performed by the semiconductor processing system.

Such systems and methods have generally been satisfactory their intended purpose. However, there remains a need for improved dew point sensor arrangements, semiconductor processing systems, and methods of sensing dew point in semiconductor processing system load locks. The present disclosure provides a solution to this need.

SUMMARY OF THE DISCLOSURE

A dew point sensor arrangement is provided. The dew point sensor arrangement includes a sensing conduit and a dry gas source conduit coupled to a dew point sensor; a sensing valve with a sensing valve member coupling the sensing conduit to the dew point sensor, the sensing valve member having a sensing valve member open position and a sensing valve member closed position; and a drying valve with a drying valve member coupling the dry gas source conduit to the dew point sensor, the drying valve member having a drying valve member open position and a drying valve member closed position. The sensing valve member fluidly separates the sensing conduit from the dew point sensor in the sensing valve member closed position, the dry gas source conduit is fluidly coupled to the dew point sensor when the drying valve member is in the drying valve member open position, and the drying valve member moves to the drying valve member open position when the sensing valve member moves to the sensing valve member closed position to dry the dew point sensor using a dry gas provided through the dry gas source conduit.

In addition to one or more of the features described above, or as an alternative, further examples of the dew point sensor arrangement may include that the sensing conduit is fluidly coupled to the dew point sensor by the sensing valve when the sensing valve member is in the sensing valve member open position.

In addition to one or more of the features described above, or as an alternative, further examples of the dew point sensor arrangement may include that the drying valve member fluidly separates the dry gas source conduit from the dew point sensor when the drying valve member is in the drying valve member closed position.

In addition to one or more of the features described above, or as an alternative, further examples of the dew point sensor arrangement may include that the drying valve member moves to the drying valve member closed position when the sensing valve member moves to the sensing valve member open position.

In addition to one or more of the features described above, or as an alternative, further examples may include an interconnect conduit coupling the dew point sensor to the sensing valve; a tee fitting connected to the interconnect conduit; and a dry gas supply conduit connected to the tee fitting and coupling the drying valve to the interconnect conduit.

In addition to one or more of the features described above, or as an alternative, further examples of the dew point sensor arrangement may include an exhaust conduit connected to the dew point sensor, and an exhaust source connected to the exhaust conduit and fluidly coupled through the dew point sensor to the sensing valve and the drying valve.

In addition to one or more of the features described above, or as an alternative, further examples of the dew point sensor arrangement may include a dry gas source connected to the dry gas source conduit and fluidly coupled by the dry gas source conduit to the drying valve.

In addition to one or more of the features described above, or as an alternative, further examples may include that the dry gas source comprises high purity nitrogen.

In addition to one or more of the features described above, or as an alternative, further examples of the dew point sensor arrangement may include a load lock connected to the sensing conduit and a purge/vent valve coupled to the load lock. The dry gas source may be coupled to the load lock to purge/vent the load lock using a dry gas provided by the dry gas source.

In addition to one or more of the features described above, or as an alternative, further examples of the dew point sensor arrangement may include a sensing valve solenoid connected to the sensing valve member and configured to move the sensing valve member between the sensing valve member open position and the sensing valve member closed position.

In addition to one or more of the features described above, or as an alternative, further examples of the dew point sensor arrangement may include a drying valve solenoid operably connected to the drying valve member and configured to move the drying valve member between the drying valve member open position to the drying valve member closed position.

In addition to one or more of the features described above, or as an alternative, further examples of the dew point sensor arrangement may include a controller responsive to instructions recorded on a non-transitory machine-readable medium to move the sensing valve member to the sensing valve member open position and move the drying valve member to the drying valve member closed position when the sensing valve member moves to the sensing valve member open position.

In addition to one or more of the features described above, or as an alternative, further examples of the dew point sensor arrangement may include that the instructions recorded on the non-transitory machine-readable medium to move the sensing valve member to the sensing valve member closed position and move the drying valve member to the drying valve member open position when the sensing valve member moves to the sensing valve member closed position.

In addition to one or more of the features described above, or as an alternative, further examples of the dew point sensor arrangement may include that the drying valve comprises a drying valve biasing member with a drying valve biasing member coefficient, that the sensing valve comprises a sensing valve biasing member with a sensing valve biasing member coefficient, and that the drying valve biasing member coefficient is greater than the sensing valve biasing member coefficient.

In addition to one or more of the features described above, or as an alternative, further examples of the dew point sensor arrangement may include that the sensing valve is a first sensing valve, the drying valve is a first drying valve, and the dew point sensor is a first dew point sensor. The dew point sensor arrangement may further include a second sensing valve connected to the sensing conduit, a second drying valve connected to the dry gas source conduit, a second dew point sensor connected to the second sensing valve and the second drying valve, and an exhaust conduit coupled to the second sensing valve and the second drying valve through the second dew point sensor. The may be coupled to the sensing conduit and the second dry gas conduit through the first dew point sensor and a controller may be disposed in communication with the first dew point sensor and the second dew point sensor and configured to at least one of (a) monitor operation of the first dew point sensor using the second dew point sensor, (b) calibrate one of the first dew point sensor and the second dew point sensor using a differential between a first dew point measurement acquired by the first dew point sensor and a second dew point measurement acquired by the second dew point sensor, (c) switch dew point sensing from one of the first dew point sensor and the second dew point sensor to the other of the first dew point sensor and the second dew point sensor using a differential between a first dew point measurement acquired by the first dew point sensor and a second dew point measurement acquired by the second dew point sensor, and (d) repair or recover one of the first dew point sensor and the second dew point sensor by providing a dry gas flow to the one of the first dew point sensor and the second dew point sensor.

A semiconductor processing system is provided. The semiconductor processing system includes a load lock coupling a front-end module to a back-end module; an evacuation valve coupling an evacuation source to the load lock; a drying valve coupling a dry gas source to the load lock; and a dew point sensor arrangement as described above. The sensing valve is coupled by the sensing conduit to the load lock and further includes a controller. The controller is responsive to instructions recorded on a memory to fluidly couple the evacuation source to the load lock using the evacuation valve; fluidly separate the dew point sensor from the load lock using the sensing valve; and fluidly couple the dry gas source to the dew point sensor using the drying valve to dry the dew point sensor while the load lock is evacuated.

In addition to one or more of the features described above, or as an alternative, further examples of the semiconductor processing system may include that the drying valve is operably associated with the sensing valve and that the sensing valve is operably associated with the load lock.

In addition to one or more of the features described above, or as an alternative, further examples of the semiconductor processing system may include that the sensing valve comprises a sensing valve solenoid connected to the sensing valve member and operably associated with the controller, and that the drying valve comprising a drying valve solenoid connected to the drying valve member and operably associated with the controller.

In addition to one or more of the features described above, or as an alternative, further examples of the semiconductor processing system may include a purge/vent gas source coupled to the load lock by a purge/vent valve. The instructions may further cause the controller to fluidly separate the evacuation source from the load lock using the evacuation valve; fluidly couple the purge/vent gas source to the load lock using the purge/vent valve; fluidly separate the dry gas source from the dew point sensor using the drying valve; fluidly couple the dew point sensor to the load lock using the sensing valve; and acquire a dew point measurement from within the load lock with the dew point sensor using a portion of a purge/vent gas provided to the load lock by the purge/vent gas source.

A dew point sensing method is provided. The method includes, at a dew point sensor arrangement as described above, fluidly coupling an evacuation source to a load lock in a semiconductor processing system; fluidly separating the dew point sensor from the load lock using the sensing valve; and fluidly coupling a dry gas source to the dew point sensor using the drying valve. A dry gas may be flowed to the dew point sensor through the drying valve and the dew point sensor dried while the load lock is evacuated using a dry gas provided to the dew point sensor by the dry gas source. The drying valve member moves to the drying valve member open position when the sensing valve member moves to the sensing valve member closed position to dry the dew point sensor using the dry gas provided through the dry gas source conduit.

In addition to one or more of the features described above, or as an alternative, further examples of the dew point sensing method may include fluidly separating the evacuation source from the load lock; fluidly coupling a purge/vent gas source to the load lock using a purge/vent valve; and fluidly separating the dry gas source from the dew point sensor using the drying valve. The dew point sensor may be fluidly coupled to the load lock using the sensing valve and a dew point measurement acquired from within the load lock using a portion of a purge/vent gas provided to the load lock by the purge/vent gas source.

In addition to one or more of the features described above, or as an alternative, further examples of the dew point sensing method may include that the sensing valve is a first sensing valve, the drying valve is a first drying valve, and the dew point sensor is a first dew point sensor. The method may further include one or more of (a) monitoring operation of the first dew point sensor using a second dew point sensor, (b) calibrating one of the first dew point sensor and the second dew point sensor using a differential between a first dew point measurement acquired by the first dew point sensor and a second dew point measurement acquired by the second dew point sensor, (c) switching dew point sensing from one of the first dew point sensor and the second dew point sensor to the other of the first dew point sensor and the second dew point sensor using a differential between a first dew point measurement acquired by the first dew point sensor and a second dew point measurement acquired by the second dew point sensor, and (d) repair or recover one of the first dew point sensor and the second dew point sensor by providing a dry gas flow to the one of the first dew point sensor and the second dew point sensor.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
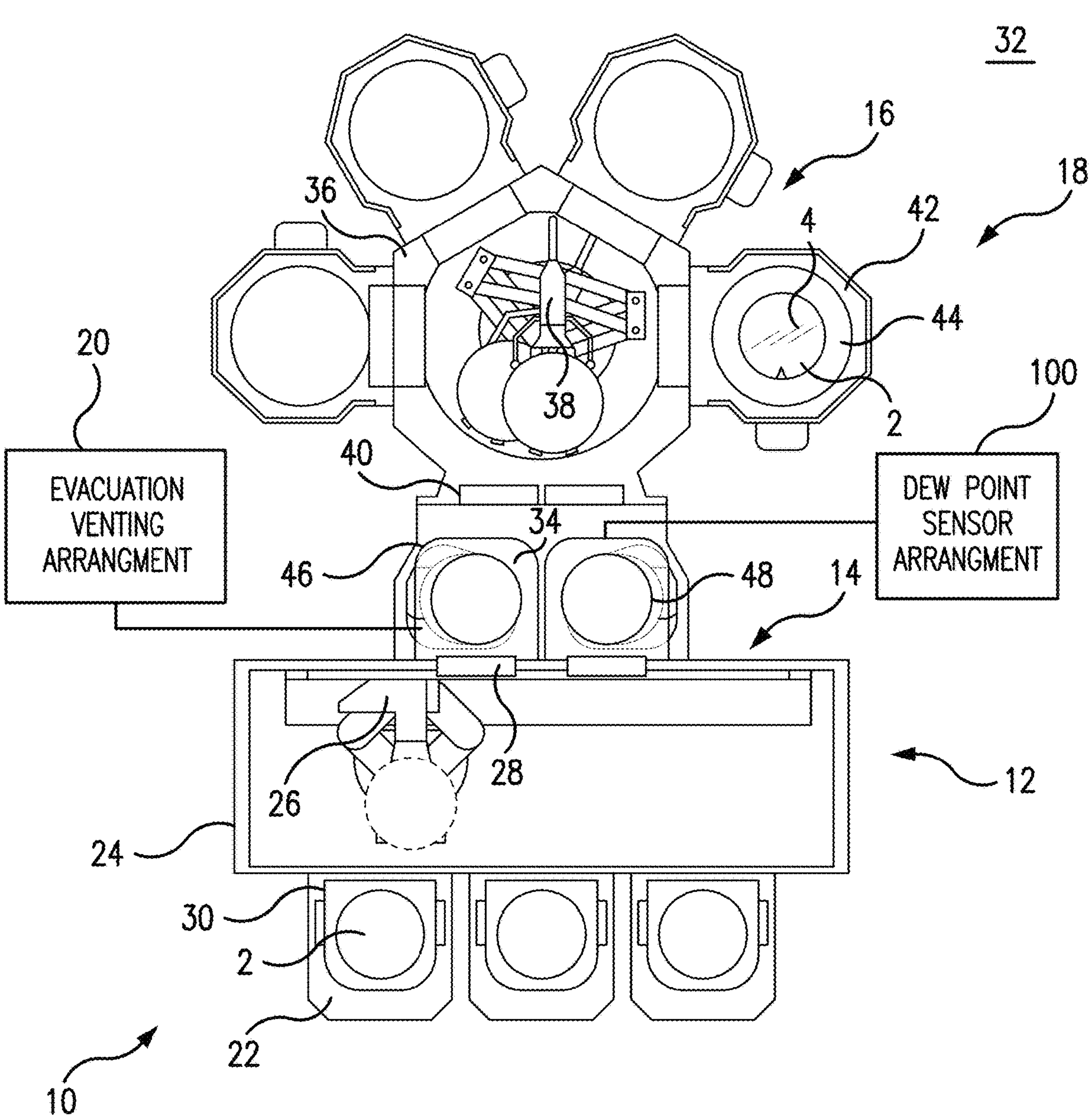
FIG. 1 is a schematic view of a semiconductor processing system with a load lock and dew point sensor arrangement in accordance with the present disclosure, showing the dew point sensor arrangement connected to the load lock to measure dew point in the load lock.

FIGS. 10-12 and 17 are flow diagrams of methods of sensing dew point in a semiconductor processing system, showing operations of the methods according to illustrative and non-limiting examples of the method; and FIGS. 13-16 are schematic views of another example of the load lock and the dew point sensor arrangement of FIG. 1 according to an example of the present disclosure, showing a dew point sensor arrangement including a first dew point sensor and a second dew point sensor.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a partial view of an example of a dew point sensor arrangement in accordance with the present disclosure is shown in FIG. 1 and is designated generally by reference character 100. Other examples of dew point sensor arrangements, semiconductor processing systems including dew point sensor arrangements, and methods of sensing dew point in semiconductor processing systems in accordance with the present disclosure, or aspects thereof, are provided in FIGS. 2-17, as will be described. The systems and methods of the present disclosure may be used to control moisture in semiconductor processing systems, such as in semiconductor processing systems employed to deposit material layers onto substrates using chemical vapor deposition (CVD) or atomic layer deposition (ALD) techniques, though the present disclosure is not limited to any particular deposition technique or to semiconductor processing systems employed for material layer deposition in general.

Referring to FIG. 1, the semiconductor processing system 10 is shown. The semiconductor processing system 10 includes a front-end module 12, a load lock 14, and a back-end module 16. The semiconductor processing system 10 also includes a process module 18, an evacuation/venting arrangement 20, and the dew point sensor arrangement 100. The front-end module 12 is connected to the load lock 14. The load lock 14 is connected to the back-end module 16 and includes the dew point sensor arrangement 100. The back-end module 16 is connected to the process module 18 and couples the process module 18 to the load lock 14. As shown and described herein the semiconductor processing system 10 has four (4) process modules. As will be appreciated by those of skill in the art in view of the present disclosure, the semiconductor processing system 10 may have fewer or additional process modules and remain within the scope of the present disclosure.

The front-end module 12 includes a load port 22, an enclosure 24, a front-end substrate transfer robot 26, and a front-end gate valve 28. The load port 22 is connected to the enclosure 24 and is configured to seat thereon a pod 30, e.g., a front-opening unified pod, containing one or more substrates, e.g., a substrate 2. The enclosure 24 is connected to the front-end gate valve 28, houses the front-end substrate transfer robot 26, and is configured to maintain a pressure substantially equivalent or slightly higher than pressure within the external environment 32. The front-end substrate transfer robot 26 is supported for movement within the interior of the enclosure 24 and is configured to transfer substrates, e.g., the substrate 2, between the load port 22 and the load lock 14. The front-end gate valve 28 is connected to the load port 22, couples the front-end module 12 to the load lock 14, and is configured to fluidly couple the interior of the enclosure 24 to an interior 34 of the load lock 14. It is contemplated that the front-end gate valve 28 have an open position and a closed position, the front-end gate valve 28 fluidly coupling the interior 34 the load lock 14 to the interior of the enclosure 24 in the open position, the front-end gate valve 28 fluidly separating the interior 34 of the load lock 14 from the interior of the enclosure 24 in the closed position.

The back-end module 16 includes a transfer chamber 36, a back-end substrate transfer robot 38, and a back-end gate valve 40. The transfer chamber 36 is connected to the front-end gate valve 28, is coupled to the load lock 14 by the front-end gate valve 28, and is configured for evacuation, e.g., evacuation to a pressure that is between about 0.1 torr and about 10 torr, by an evacuation pump arrangement. The back-end substrate transfer robot 38 is supported for movement within the transfer chamber 36 and configured to transfer substrates between the load lock 14 and the process module 18. The back-end gate valve 40 is connected to the transfer chamber 36, couples the transfer chamber 36 to the process module 18, and is configured to provide selective communication between the back-end module 16 and the process module 18 for transfer of substrates, e.g., the substrate 2, between the back-end module 16 and the process module 18. It is contemplated that the back-end gate valve 40 have an open position and a closed position, the back-end gate valve 40 fluidly coupling the interior of the transfer chamber 36 to the process module 18 in the open position, the back-end gate valve 40 fluidly separating the interior of the transfer chamber 36 from the process module 18 in the closed position.

The process module 18 includes a process chamber 42 and a substrate support 44, and is configured to deposit a material layer 4 onto substrates, e.g., the substrate 2, while seated of the substrate support 44. In this respect the process chamber 42 is connected to the back-end gate valve 40 and is coupled by the back-end gate valve 40 to the transfer chamber 36. The substrate support 44 is arranged within an interior of the process chamber 42 and is configured to support a substrate, e.g., the substrate 2, during deposition of a material layer, e.g., the material layer 4, onto the substrate. In certain examples, the process module 18 may be configured to deposit the material layer 4 onto the substrate 2 using an ALD technique. In accordance with certain examples, the process module 18 may be configured to deposit the material layer 4 onto the substrate 2 using a CVD technique such as epitaxy. As will be appreciated by those of skill in the art in view of the present disclosure, the process module 18 may be arranged to perform other operations, e.g., an etching operation to remove an oxide from the substrate 2 and/or to deposit the material layer 4 using another deposition technique, and remain within the scope of the present disclosure.

The load lock 14 couples the front-end module 12 to the back-end module 16, includes a load lock chamber 46 and a chill plate/storage rack 48, and is configured for cyclic evacuation and venting using evacuation/venting arrangement 20. In this respect evacuation/venting arrangement 20 is connected to the load lock 14. In further respect, the chill plate/storage rack 48 is arranged within the interior 34 of the load lock 14 and is configured to support one or more substrate, e.g., the substrate 2. In certain examples, the chill plate/storage rack 48 may include a chill plate configured for cooling a substrate seated on the chill plate. In accordance with certain examples, the chill plate/storage rack 48 may include a storage rack having one or more storage slot. It is also contemplated that, in accordance with certain examples, that the chill plate/storage rack 48 may include a chill plate and a storage rack and remain within the scope of the present disclosure.

As has been explained above, moisture infiltration into evacuated spaces can, in some semiconductor processing systems, limit reliability of the semiconductor processing systems and/or influence properties of semiconductor devices fabricated using the semiconductor processing systems. To avoid limiting reliability of the semiconductor processing system 10 and/or properties of semiconductor devices fabricated using the material layer 4, the dew point sensor arrangement 100 is provided. The dew point sensor arrangement 100 is connected to the load lock 14 and includes a dew point sensor 106 (shown in FIG. 3). The dew point sensor 106 is coupled to the load lock 14 and a dry gas source 124 (shown in FIG. 3) by a sensing valve 102 (shown in FIG. 3) and a drying valve 104 (shown in FIG. 3). The sensing valve 102 provides selective fluid communication between the load lock 14 and the dew point sensor 106 for acquiring measurements of dew point in the load lock 14 for controlling moisture in the semiconductor processing system 10. The drying valve 104 provides selective fluid communication to between a dry gas source 124 (shown in FIG. 3) to dry the dew point sensor 106, improving accuracy of dew point measurements acquired using the dew point sensor 106 for reliable moisture control.

Figure 2:
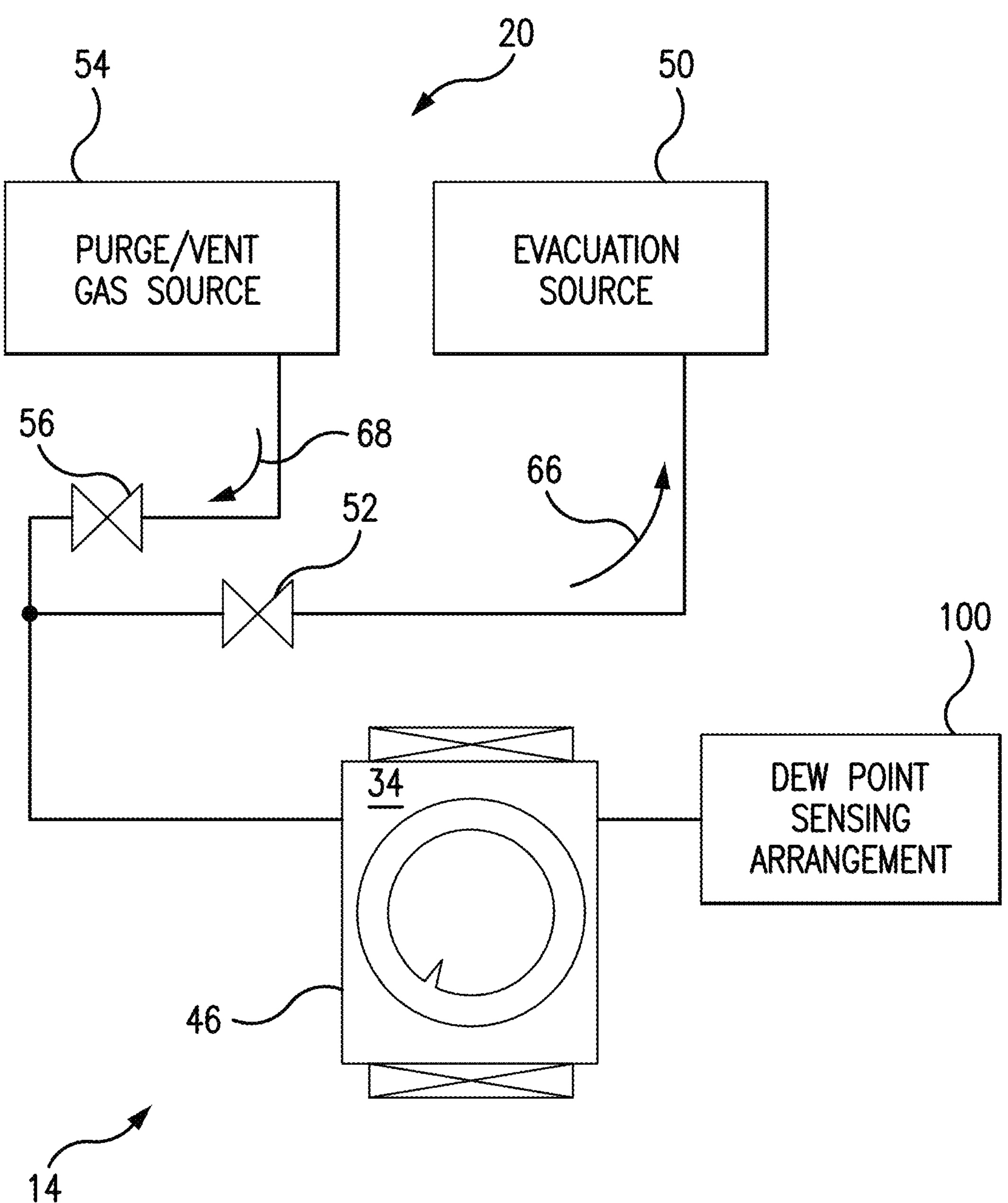
FIG. 2 is a schematic view of a portion of semiconductor processing system including the load lock of FIG. 1, showing an evacuation/venting arrangement connected to the load lock for cyclically evacuating and ventilating the load lock.

With reference to FIG. 2, the load lock 14 and the evacuation/venting arrangement 20 are shown. The evacuation/venting arrangement 20 is configured to cyclically ventilate and evacuate the load lock 14 and in this respect is connected to the load lock 14. In the illustrated example the evacuation/venting arrangement 20 includes an evacuation source 50, an evacuation valve 52, a purge/vent gas source 54, and a purge/vent valve 56. As will be appreciated by those of skill in the art in view of the present disclosure, the evacuation/venting arrangement 20 may include fewer or additional elements and/or have a different arrangement than as shown and described herein, and remain within the scope of the present disclosure.

The evacuation valve 52 is connected to the load lock chamber 46, couples the evacuation source 50 to the load lock chamber 46, and provides selective fluid communication between the evacuation source 50 and the interior 34 of the load lock chamber 46. In this respect it is contemplated that the evacuation valve 52 have an evacuation valve open position 58 and an evacuation valve closed position 60. When in the evacuation valve open position 58, the evacuation valve 52 fluidly couples the evacuation source 50 to the interior 34 of the load lock chamber 46. When in the evacuation valve closed position 60, the evacuation valve 52 fluidly separates the evacuation source 50 from the interior 34 of the load lock chamber 46, the evacuation source 50 thereby drawing a flow of evacuated fluid 66 from within the interior 34 of the load lock chamber 46. Transition between the evacuation valve open position 58 and the evacuation valve closed position 60 may be accomplished by operably association of the evacuation valve 52 with a controller through a solenoid and a valve member, although other arrangements are possible within the scope of the present disclosure.

The evacuation source 50 is configured to evacuate the interior 34 of the load lock chamber 46 by drawing the flow of the evacuated fluid 66 from the interior 34 of the load lock 14. In this respect it is contemplated that the evacuation source 50 include an evacuation pump. In certain examples, the evacuation source 50 may include a roughing pump configured to evacuate the interior 34 of the load lock chamber 46 to a first pressure, a booster pump configured to evacuate the interior 34 of the load lock chamber 46 to a second pressure lower than the first pressure, and a cutover valve configured to fluidly couple the booster pump the interior 34 of the load lock chamber 46 once pressure therein reaches the first pressure. In accordance with certain examples, the evacuation pump may be configured to evacuate the interior 34 of the load lock chamber 46 to a gauge pressure that is about 1000 millibars below ambient pressure (e.g., about 1000 millibars) or to an absolute pressure of about 1E-2 millibars.

The purge/vent valve 56 is connected to the load lock chamber 46, couples the evacuation source 50 to the load lock chamber 46, and provides selective fluid communication between the purge/vent gas source 54 and the interior 34 of the load lock chamber 46. In this respect it is contemplated that the purge/vent valve 56 have a purge/vent valve open position 62 and a purge/vent valve closed position 64. When in the purge/vent valve open position 62 the purge/vent valve 56 fluidly couples the purge/vent gas source 54 to the interior 34 of the load lock chamber 46 such that the purge/vent gas source 54 may provide a flow of purge/vent gas 68 to the interior 34 of the load lock chamber 46. When in the purge/vent valve closed position 64, the purge/vent valve 56 fluidly separates the purge/vent gas source 54 from the interior 34 of the load lock chamber 46. Transition between the purge/vent valve open position 62 and the purge/vent valve closed position 64 may also be accomplished, for example, by operable association of the purge/vent valve 56 with a controller through a solenoid and a valve member, although other arrangements are possible within the scope of the present disclosure.

The purge/vent gas source 54 is configured to provide the flow of a purge/vent gas 68 to the interior 34 of the load lock chamber 46 when the purge/vent valve 56 is in the purge/vent valve open position 62, such as an inert gas. In certain examples, the purge/vent gas 68 may include cleanroom air, such as cleanroom air ingested from the external environment 32 (shown in FIG. 1) outside of the semiconductor processing system 10 (shown in FIG. 1). In accordance with certain examples, the purge/vent gas 68 may include clean, dry air (CDA), such as from a house CDA source. In further examples, the purge/vent gas 68 may include (e.g., consist of or consist essentially of) nitrogen. It is also contemplated that, in accordance with certain examples, the purge/vent gas 68 may include high purity nitrogen (HPN), such as from a house HPN source.

Figure 3:
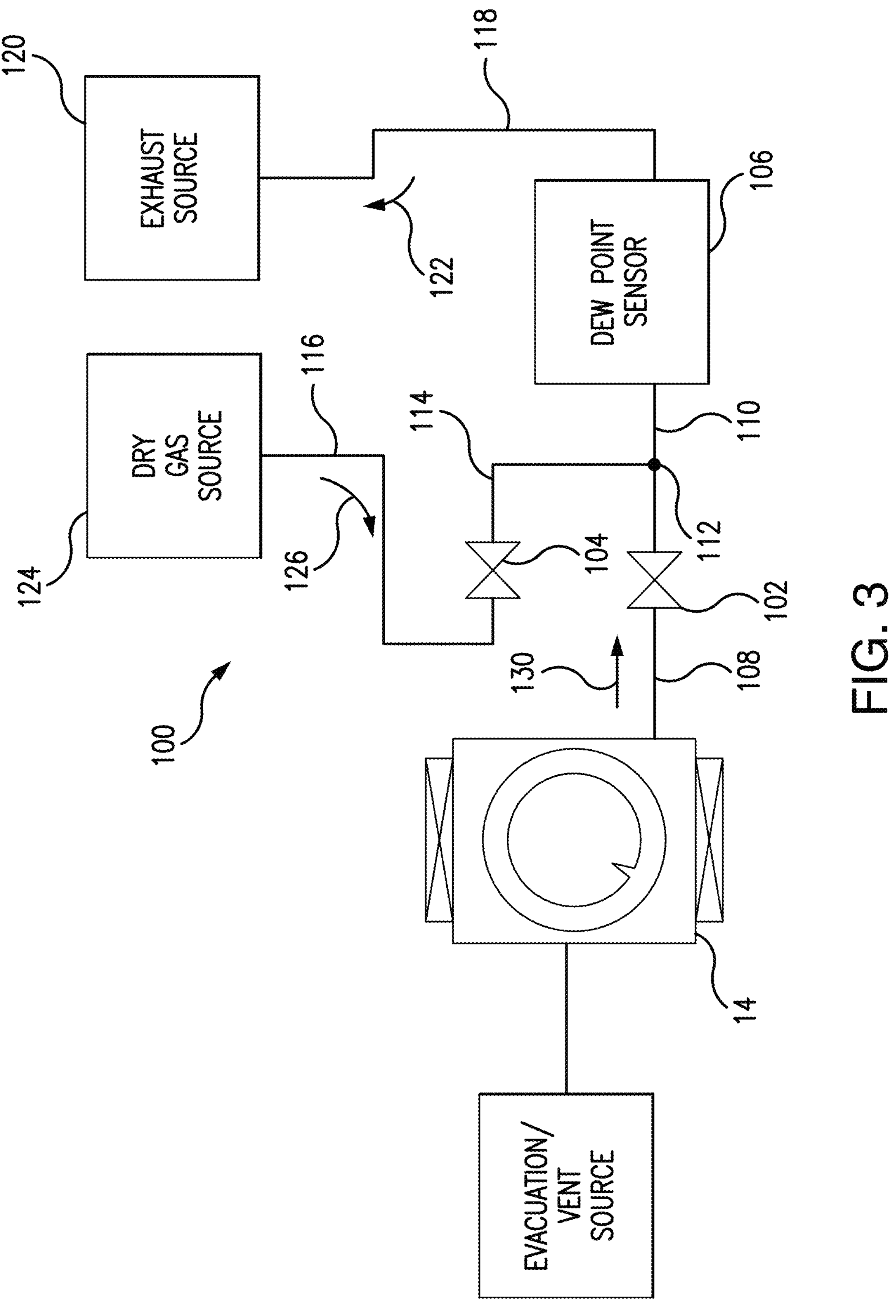
FIG. 3 is a schematic view of the load lock and the dew point sensor arrangement of FIG. 1 according to a first example, showing a dew point sensor connected to the load lock by a sensing valve and a dry gas source connected to the dew point sensor by a drying valve.
Figure 4:
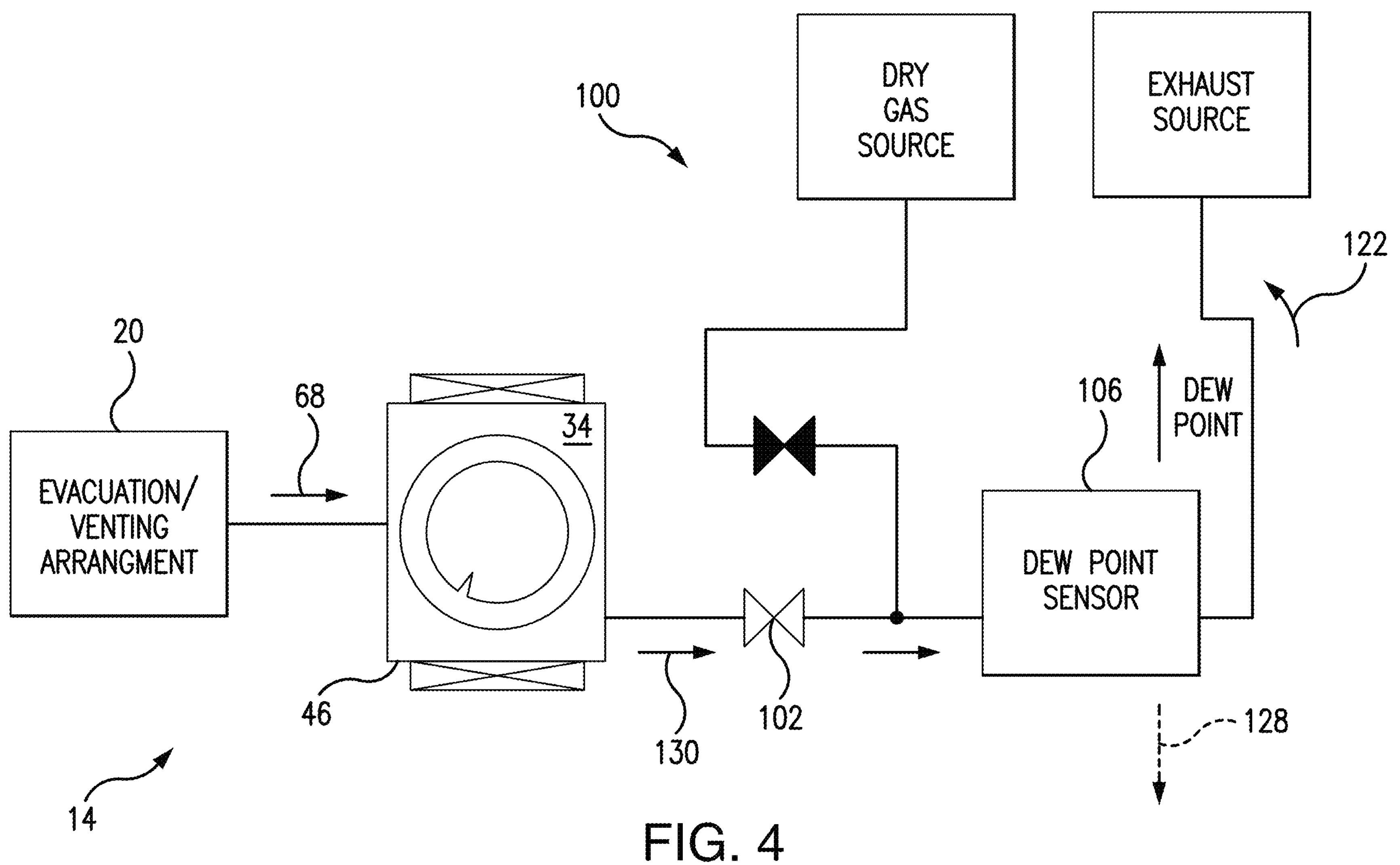
FIG. 4 is a schematic view of the load lock and the dew point sensor arrangement of FIG. 1 according to the first example, showing the sensing valve fluidly coupling the dew point sensor to the load lock while the load lock is ventilated to measure dew point in the load lock.
Figure 5:
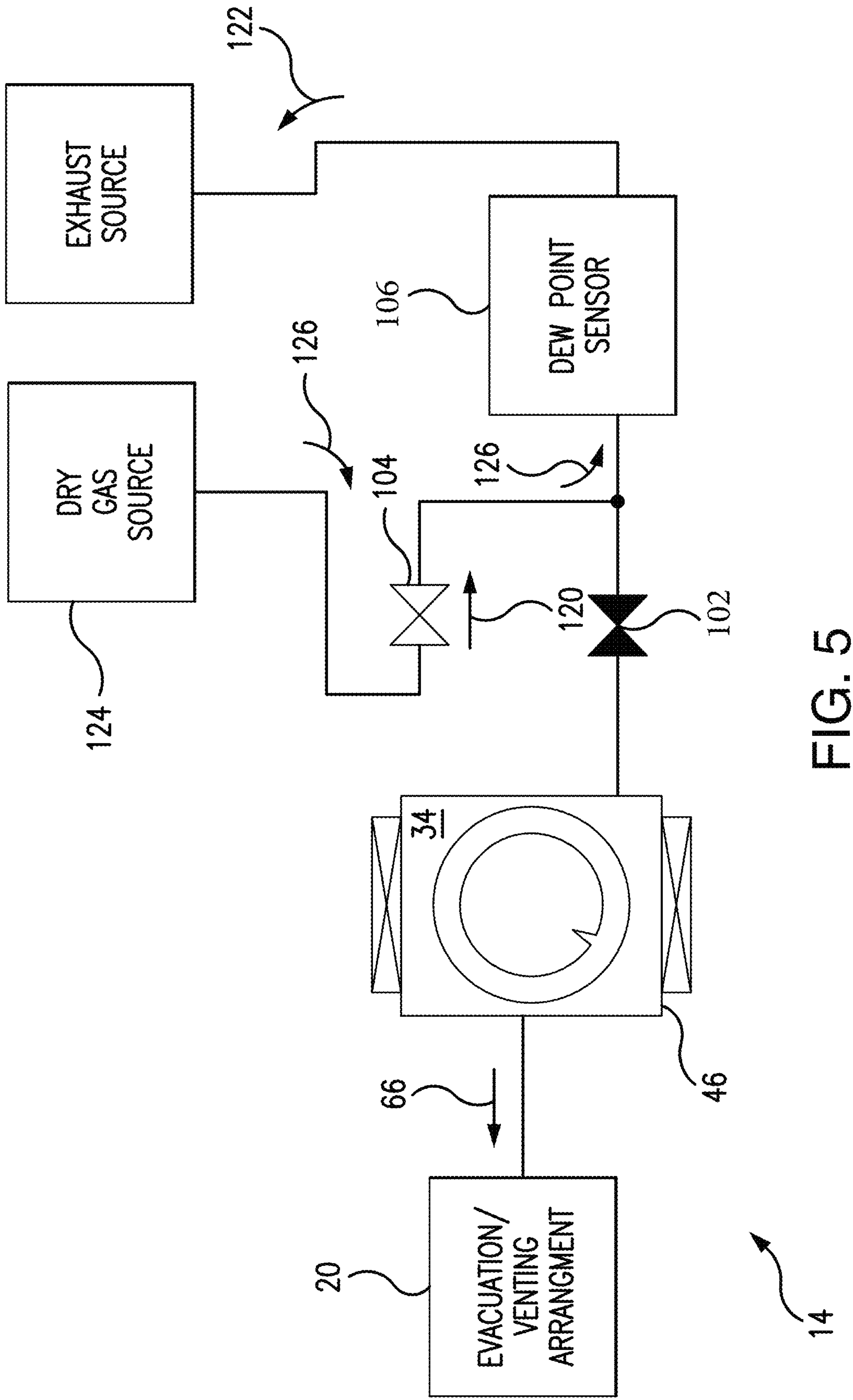
FIG. 5 is a schematic view of the load lock and the dew point sensor arrangement of FIG. 1 according to the first example, showing the drying valve fluidly coupling the dry gas source to the dew point sensor while the load lock is evacuated to dry the dew point sensor.

With reference to FIGS. 3-5, the dew point sensor arrangement 100 is shown. As shown in FIG. 3, the dew point sensor arrangement 100 includes a sensing valve 102, a drying valve 104, and a dew point sensor 106. The dew point sensor arrangement 100 also includes a sensing conduit 108, an interconnect conduit 110, and a tee fitting 112. The dew point sensor arrangement 100 further includes a dry gas supply conduit 114, a dry gas source conduit 116, and an exhaust conduit 118. Although a specific arrangement is shown and described herein it is to be understood and appreciated that the dew point sensor arrangement 100 may have different arrangement and remain within the scope of the present disclosure.

The sensing conduit 108 is connected to the load lock 14, couples the sensing valve 102 to the load lock 14, and couples the dew point sensor 106 therethrough the load lock 14. The sensing valve 102 is connected to the sensing conduit 108 and couples the interconnect conduit 110 to the sensing conduit 108. The dew point sensor 106 is connected to the interconnect conduit 110 and is coupled to the sensing valve 102 by the interconnect conduit 110. The exhaust conduit 118 is connected to the dew point sensor 106 and couples an exhaust source 120 to the dew point sensor 106. The exhaust source 120 is connected to the exhaust conduit 118, is coupled to the dew point sensor 106 by the exhaust conduit 118, and is configured to draw an exhaust flow 122 through the dew point sensor 106. In certain examples, the exhaust source 120 may include a fan or a blower to draw the exhaust flow 122 through (or across) the dew point sensor 106.

The tee fitting 112 is connected to the interconnect conduit 110, is coupled to the sensing valve 102 and the dew point sensor 106 by the interconnect conduit 110, and couples the dry gas supply conduit 114 to the interconnect conduit 110. The drying valve 104 is connected to the dry gas supply conduit 114, is coupled to the interconnect conduit 110 by the tee fitting 112, and couples the dry gas source conduit 116 to the dry gas supply conduit 114. The dry gas source conduit 116 is connected to the drying valve 104, is coupled by the drying valve 104 to the dry gas supply conduit 114, and couples a dry gas source 124 to the drying valve 104. The dry gas source 124 is connected to the dry gas source conduit 116, is coupled to the drying valve 104 by the dry gas supply conduit 114, and is configured to provide a dry gas 126 to the dew point sensor 106. In certain examples, the dry gas 126 may include (e.g., consist of or consist essentially of) nitrogen. In accordance with certain examples, the dry gas 126 may include (e.g., consist of or consist essentially of) HPN. It is also contemplated that, in further examples, the dry gas source 124 and the purge/vent gas source 54 may be a common gas source. The dry gas 126 may have a moisture content that is less than about 100 ppm, or less than about 50 ppm, or less than about 10 ppm, or even less than about 3 ppm.

The dew point sensor 106 is configured to generate a dew point signal 128 indicative of dew point within a sensing gas 130 received by the dew point sensor 106. In certain examples, the dew point sensor 106 may include a hydrometer. For example, the dew point sensor 106 may include a capacitive hydrometer or a resistive hydrometer. The dew point sensor 106 may also include a thermal hydrometer, a gravimetric hydrometer, or an optical hydrometer. Examples of suitable dew point sensors include Michell Pura trace moisture transmitters, available from Michell Instruments of Ely, United Kingdom.

The sensing valve 102 is configured to provide selective fluid communication between the load lock 14 and the dew point sensor 106. More specifically, the sensing valve 102 is configured to provide selective fluid communication between the interior 34 of the load lock chamber 46 and the dew point sensor 106. As shown in FIG. 4, the sensing valve 102 is configured to provide fluid communication between the interior 34 of the load lock chamber 46 and the dew point sensor 106 when the interior 34 of the load lock chamber 46 is under purge or is being vented, e.g., when the purge/vent gas source 54 (shown in FIG. 2) provides the purge/vent gas 68 to the load lock 14. As shown in FIG. 5, the sensing valve 102 is configured to fluidly separate the interior 34 of the load lock chamber 46 from the dew point sensor 106 when the evacuation source 50 (shown in FIG. 2) is fluidly coupled to the interior 34 of the load lock 14. As will be appreciated by those of skill in the art in view of the present disclosure, fluid communication between load lock 14 and the dew point sensor 106 allows dew point sensor 106 to indicate dew point within the interior 34 of the load lock chamber 46 using the dew point signal 128 using the sensing gas 130.

The drying valve 104 is configured to provide selective fluid communication between the dry gas source 124 and the dew point sensor 106. As shown in FIG. 4, the drying valve 104 is configured to fluidly separate the dry gas source 124 from the dew point sensor 106 when the interior 34 of the load lock chamber 46 is purged/vented, e.g., when the purge/vent gas 68 is provided to the load lock 14 by the evacuation/venting arrangement 20. As shown in FIG. 5, the drying valve 104 is further configured to fluidly couple the dew point sensor 106 to the dry gas source 124 when the interior 34 of the load lock chamber 46 is evacuated, e.g., when the evacuation/venting arrangement 20 draws the evacuated fluid 66 from the load lock 14. As will be appreciated by those of skill in the art in view of the present disclosure, fluid communication between dry gas source 124 and the dew point sensor 106 allows the dew point sensor 106 to be dried by the dry gas 126 while the interior 34 of the load lock chamber 46 is evacuated. As will also be appreciated by those of skill in the art in view of the present disclosure, drying the dew point sensor 106 with the dry gas 126 while the load lock 14 is evacuated limits exposure of dew point sensor 106 to swings in moisture content in fluid provided to the dew point sensor 106 during evacuation of the interior 34 of the load lock chamber 46. Limiting exposure to swings in moisture content can improve accuracy of the dew point sensor 106 by restricting operation of the dew point sensor 106 to a moisture content range wherein the dew point sensor 106 responds linearly to change in moisture content in fluid traversing the dew point sensor 106.

Figure 6:
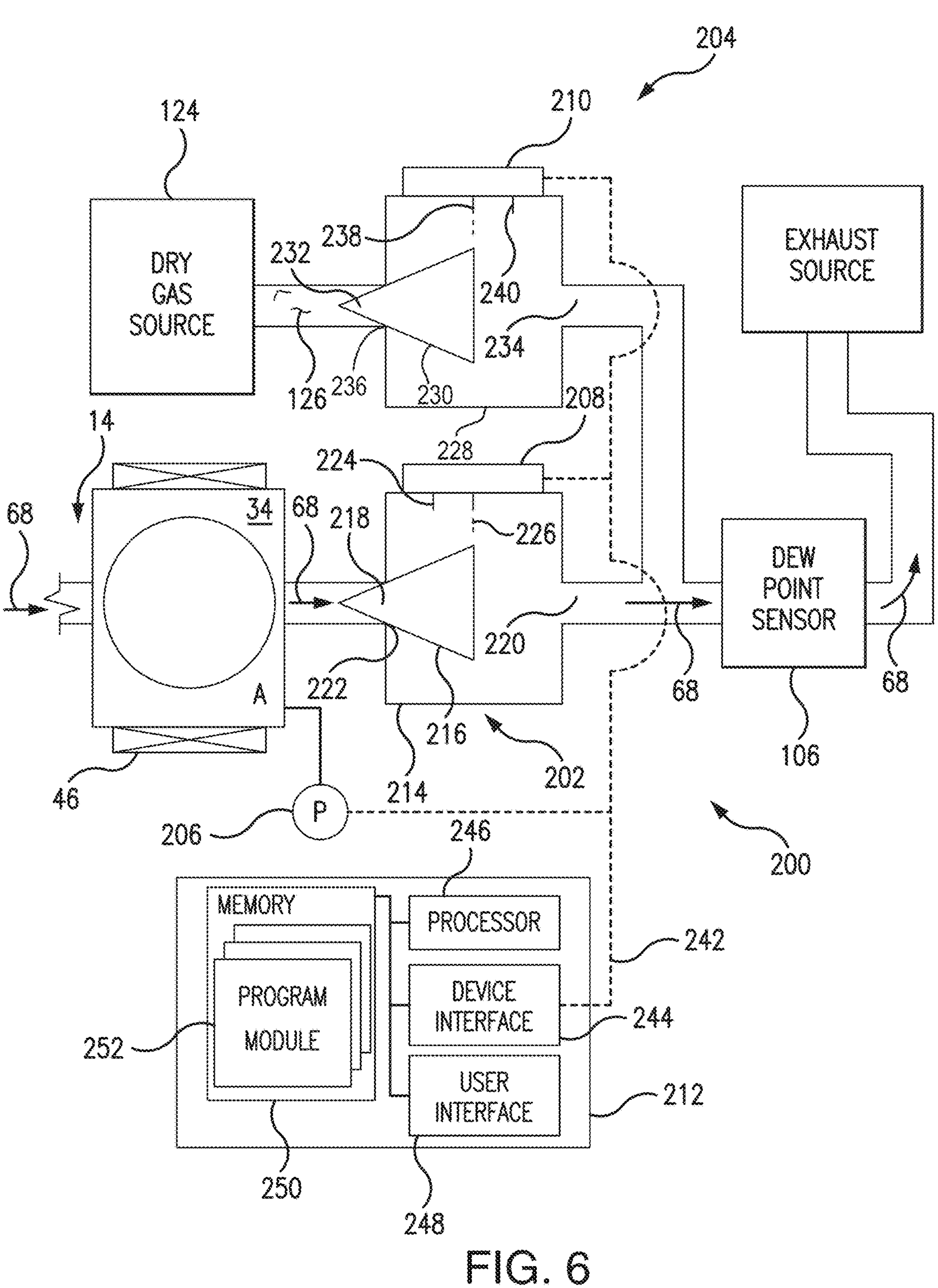
FIG. 6 is a schematic view of the load lock and the dew point sensor arrangement of FIG. 1 according to a second example, showing a solenoid-actuated sensing valve fluidly coupling the dew point sensor to the load lock while the load lock is vented to measure dew point in the load lock.
Figure 7:
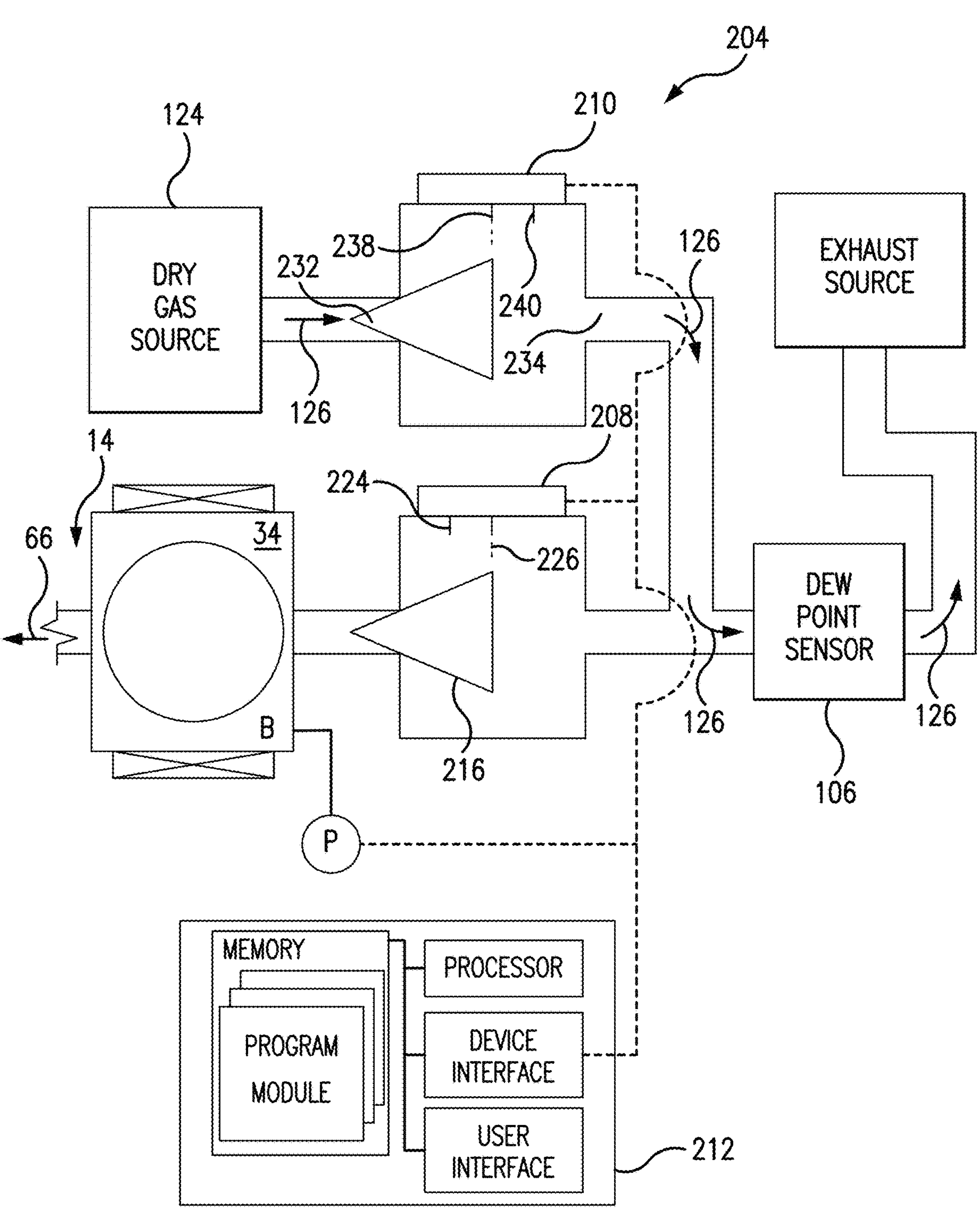
FIG. 7 is a schematic view of the load lock and the dew point sensor arrangement of FIG. 1 according to the second example, showing a solenoid-actuated drying valve fluidly coupling the dry gas source to the dew point sensor while the load lock is under vacuum to dry the dew point sensor.

In certain examples, the dry gas source 124 and the purge/vent gas source 54 may be a common gas source. In such examples it is contemplated that the load lock 14 is connected to the sensing conduit 108, the purge/vent valve 56 (shown in FIG. 2) couples the dry gas source 124 to the load lock 14, and the load lock 14 may be purged/vented using the dry gas 126 provided by the dry gas source 125. Advantageously, the dry gas 126 provided to the dew point sensor 106 by the dry gas source 124 while the load lock 14 is evacuated may further be employed to calibrate the dew point sensor 106 (e.g., periodically or cyclically) using a known dryness of the dry gas 126, further improving accuracy of the dew point sensor 106;

With reference to FIGS. 6 and 7, a dew point sensor arrangement 200 is shown. The dew point sensor arrangement 200 is similar to the dew point sensor arrangement 100 (shown in FIG. 1) and additionally includes sensing valve 202, a drying valve 204, and a pressure sensor 206. The dew point sensor arrangement 200 also includes a sensing valve solenoid 208, a drying valve solenoid 210, and a controller 212.

The sensing valve 202 includes a sensing valve body 214 and a sensing valve member 216. The sensing valve body 214 has a sensing valve inlet port 218, a sensing valve outlet port 220, and a sensing valve seat 222. The sensing valve inlet port 218 and the sensing valve outlet port 220 are defined on opposite ends of the sensing valve body 214. The sensing valve seat 222 is located within the sensing valve body 214 between the sensing valve inlet port 218 and the sensing valve outlet port 220. The sensing valve member 216 is supported for movement within the sensing valve body 214 for movement between a sensing valve member closed position 224 and a sensing valve member open position 226. When in the sensing valve member closed position 224 the sensing valve member 216 abuts the sensing valve seat 222, the sensing valve member 216 thereby fluidly separating the sensing valve outlet port 220 from the sensing valve inlet port 218. When in the sensing valve member open position 226 the sensing valve member 216 is spaced apart from the sensing valve seat 222, the sensing valve outlet port 220 thereby fluidly coupled to the sensing valve inlet port 218 through the sensing valve body 214.

The drying valve 204 includes a drying valve body 228 and a drying valve member 230. The drying valve body 228 has a drying valve inlet port 232, a drying valve outlet port 234, and a drying valve seat 236. The drying valve inlet port 232 and the drying valve outlet port 234 are defined on opposite ends of the drying valve body 228. The drying valve seat 236 is located within the drying valve body 228 between the drying valve inlet port 232 and the drying valve outlet port 234. The drying valve member 230 is supported for movement within the drying valve body 228 for movement between a drying valve member closed position 238 and a drying valve member open position 240. When in the drying valve member closed position 238 the drying valve member 230 abuts the drying valve seat 236, the drying valve member 230 thereby fluidly separating the drying valve outlet port 234 from the drying valve inlet port 232. When in the drying valve member open position 240 the drying valve member 230 is spaced apart from the drying valve seat 236, the drying valve outlet port 234 thereby fluidly coupled to the drying valve inlet port 232 through the drying valve body 228.

The sensing valve solenoid 208 is connected to the sensing valve member 216, is configured to move the sensing valve member 216 between the sensing valve member open position 226 and the sensing valve member closed position 224, and is operably associated with the controller 212 through a link 242. The drying valve solenoid 210 is connected to the drying valve member 230, is configured to move the drying valve member 230 between the drying valve member open position 240 and the drying valve member closed position 238, and is also operably associated with the controller 212 through the link 242. It is contemplated that movement of the sensing valve member 216 and the drying valve member 230 be according to pressure reported by the pressure sensor 206, which is in pneumatic communication with the interior 34 of the load lock chamber 46, and which is also disposed communication with the controller 212 with the link 242.

The controller 212 includes a device interface 244, a processor 246, a user interface 248, and a memory 250. The device interface 244 connects the processor 246 to the sensing valve solenoid 208, the drying valve solenoid 210, and the pressure sensor 206 through the link 242. The processor 246 is disposed in communication with the device interface 244 and is operably associated with the user interface 248 to receive user input and/or provide user output therethrough. The processor 246 is further disposed in communication with the memory 250. Although the controller 212 is shown and described herein with a specific architecture, it is to be understood and appreciated that the controller 212 can have a different architecture and remain within the scope of the present disclosure.

The memory 250 includes a non-transitory machine-readable medium having a plurality of program modules 252 recorded thereon containing instructions that, when read by the processor 246 cause the processor 246 to execute certain operations. Among the operations are operation to (a) acquire pressure from within the interior 34 of the load lock chamber 46 using the pressure sensor 206, (b) compare the acquired pressure to a predetermined pressure valve, (c) move the sensing valve member 216 to the sensing valve member closed position 224 and the drying valve member 230 to the drying valve member open position 240 when the acquired pressure falls below the predetermined pressure, and (d) move the sensing valve member 216 to the sensing valve member open position 226 and the drying valve member 230 to the drying valve member closed position 238 when the acquired pressure rises above the predetermined pressure. Advantageously, employment of the controller 212 allows for independent operation of the sensing valve 202 and the drying valve 204, for example, by ceasing flow of the dry gas 126 to the dew point sensor 106 prior to fluid coupling of the load lock 14 to the dew point sensor 106 to limit backflow through the sensing valve 202.

It is contemplated that the predetermined pressure be a pressure between a purge/vent pressure A (shown in FIG. 6) and an evacuation pressure B (shown in FIG. 7). The purge/vent pressure A is established when the purge/vent gas source 54 (shown in FIG. 3) is fluidly coupled to the interior 34 of the load lock chamber 46 and provides the purge/vent gas 68 to the load lock 14. The evacuation pressure B is established when the evacuation source 50 (shown in FIG. 3) is fluidly coupled to the interior 34 of the load lock chamber 46 and draws the evacuated fluid 66 from the load lock 14. In certain examples, predetermined pressure may be a gauge pressure that is between ambient pressure (e.g., about 1000 millibars) and about 1000 millibars below ambient pressure, or a gauge pressure that is between ambient pressure and about 990 millimeters, or even a gauge pressure that is between ambient pressure about 900 millibars below ambient pressure. In accordance with certain examples, the predetermined pressure may be within the pump down range of a roughing pump employed to evacuate the load lock 14. In accordance with certain examples, the predetermined pressure may be a boosted pressure established by compounding the roughing pump with a booster pump during the evacuation of the load lock 14.

As shown in FIG. 6, fluid coupling of the dew point sensor 106 to the load lock 14 by the sensing valve 202 and fluid separation of the dew point sensor from the dry gas source 124 allows the dew point sensor 106 to acquire a dew point measurement 254 using purge/vent gas 68 admitted into the interconnect conduit 110 from the load lock 14 through the sensing valve 202 while the load lock is being ventilated, e.g., while fluidly coupled to the purge/vent gas source 54 (shown in FIG. 2). As shown in FIG. 7, fluid separation of the dew point sensor 106 by the sensing valve 202 from the load lock 14 and fluid coupling of the dew point sensor 106 to the dry gas source 124 allows the dew point sensor 106 to be dried using dry gas 126 admitted into the interconnect conduit 110 from the load lock 14 through the drying valve 204 while the load lock is being evacuated, e.g., while fluidly coupled to the evacuation source 50 (shown in FIG. 2). It is contemplated that the dry gas 126 dry the dew point sensor 106, keeping moisture contain expo sure within a range wherein response of the dew point sensor 106 is linear during ventilation/evacuation cycles of the load lock 14.

As will be appreciated by those of skill in the art in view of the present disclosure, moving the sensing valve member 216 to the sensing valve member open position 226 and the drying valve member 230 to the drying valve member closed position 238 when pressure rises above the predetermined pressure value allows the dew point sensor 106 to acquire dew point measurements from within the interior 34 of the load lock chamber 46 during intervals within which the load lock 14 is being ventilated—and potentially subject to moisture infiltration may be present. As will also be appreciated by those of skill in the art in view of the present disclosure, moving the sensing valve member 216 to the sensing valve member closed position 224 and the drying valve member 230 to the drying valve member open position 240 when pressure falls below the predetermined pressure value allows the dew point sensor 106 to be dried using dry gas provided by the dry gas source 124, improving accuracy of dew point measurements acquired by the dew point sensor 106 during the subsequent ventilation cycle by limiting the range of moisture concentration to which the dew point sensor 106 is exposed. In certain examples, accuracy of dew point measurements acquired by the dew point sensor 106 may be between 30% and about 50% more accurate than in implementations without drying, improving the ability to control moisture in the load lock 14.

Figure 8:
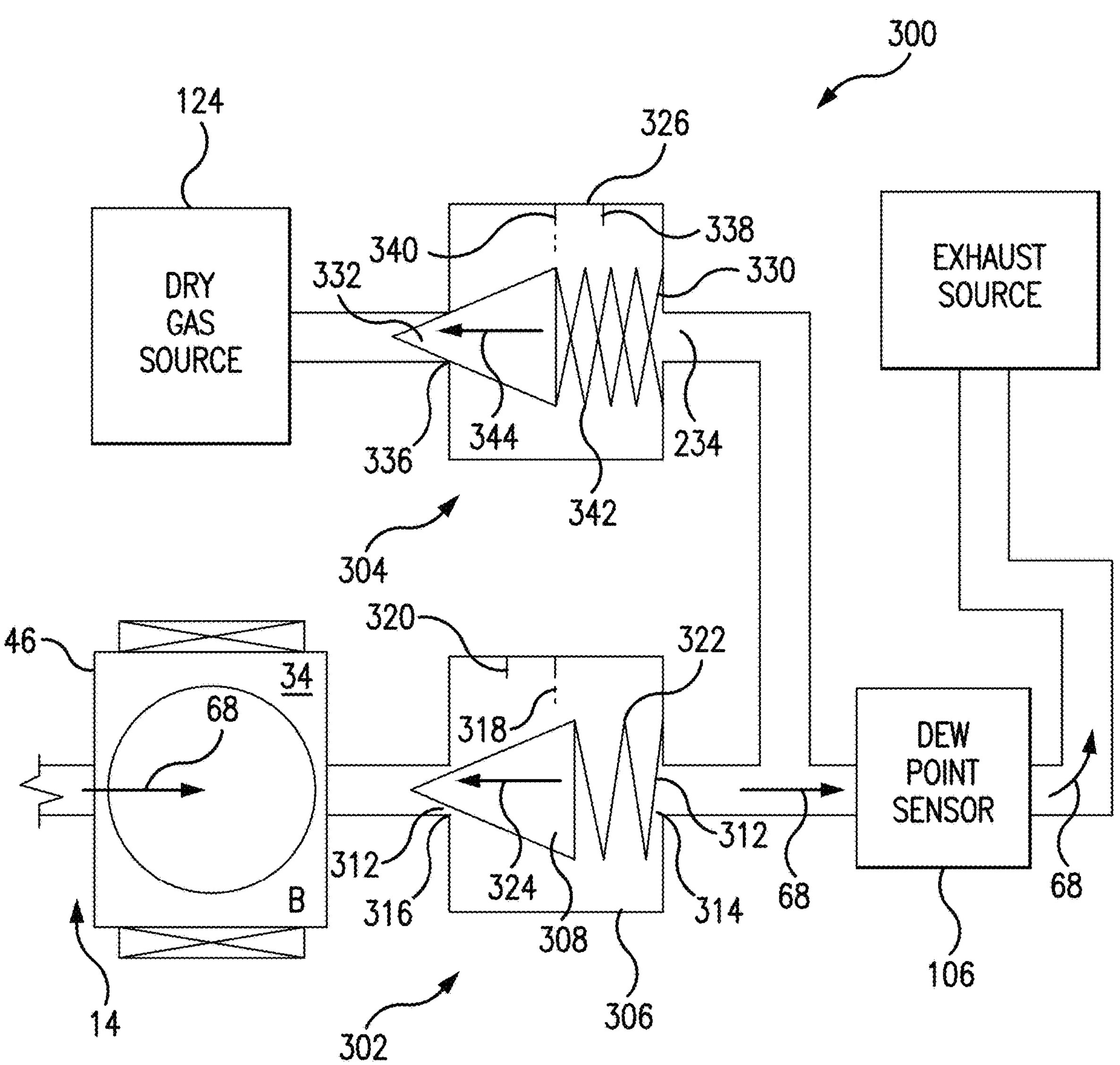
FIG. 8 is a schematic view of the load lock and the dew point sensor arrangement of FIG. 1 according to a third example, showing a sensing valve actuated by pressure within the load lock fluidly coupling the dew point sensor to the load lock while the load lock is ventilated to measure dew point in the load lock.
Figure 9:
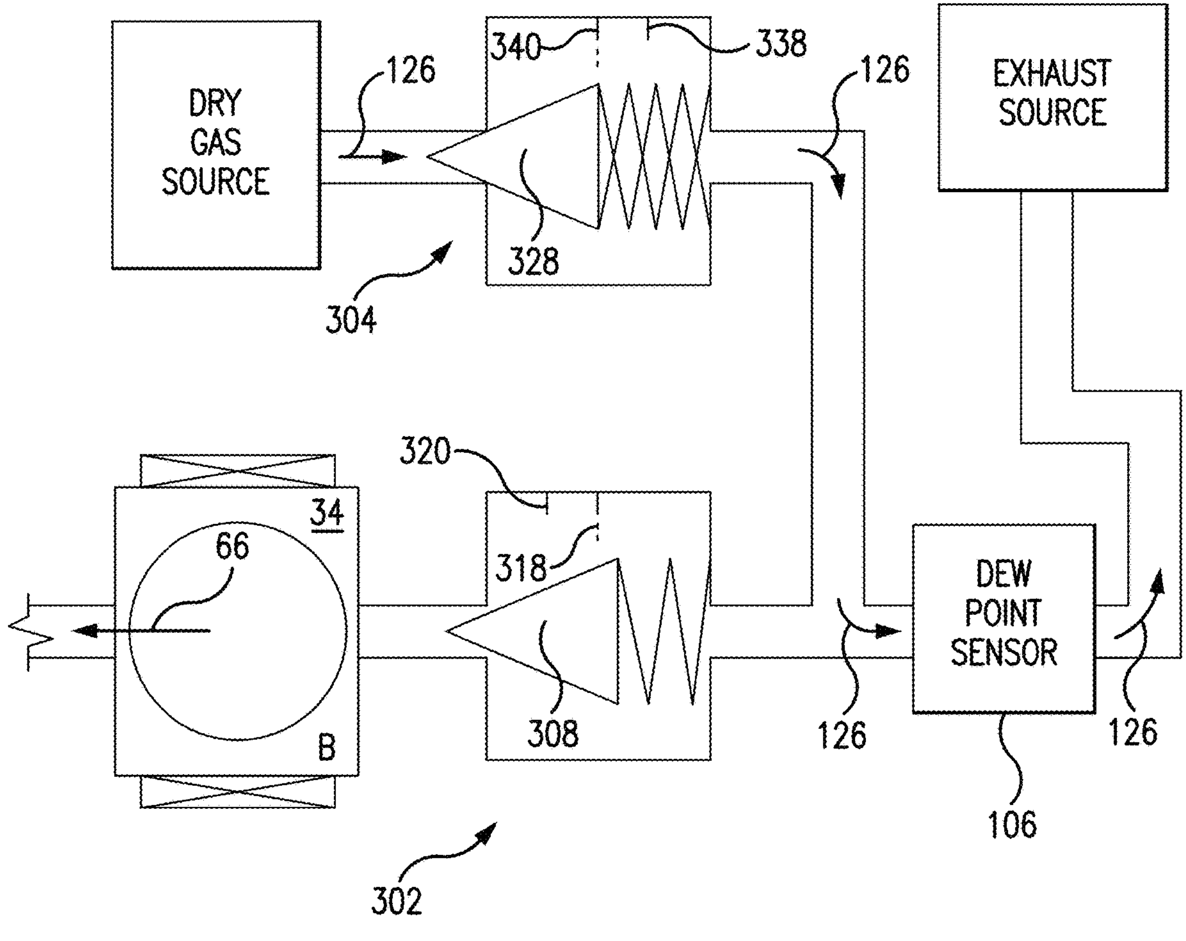
FIG. 9 is a schematic view of the load lock and the dew point sensor arrangement of FIG. 1 according to the third example, showing a drying valve actuated by the sensing valve fluidly coupling the dry gas source to the dew point sensor while the load lock is under vacuum to dry the dew point sensor.

With reference to FIGS. 8 and 9, a dew point sensor arrangement 300 is shown. The dew point sensor arrangement 300 is similar to the dew point sensor arrangement 100 (shown in FIG. 1) and additionally includes a sensing valve 303 and a drying valve 304. The sensing valve 303 is configured to fluidly couple the dew point sensor 106 to the interior 34 of the load lock chamber 46 when pressure within the interior 34 rises above a predetermined pressure. The sensing valve 303 is further configured to fluidly separate the dew point sensor 106 from the interior 34 of the load lock chamber 46 when pressure within the interior 34 of the load lock chamber 46 falls below the predetermined pressure. The drying valve 304 is configured to fluidly separate the dew point sensor 106 from the dry gas source 134 when the sensing valve 303 fluidly couples the dew point sensor 106 to the interior 34 of the load lock chamber 46. The drying valve 304 is further configured to fluidly couple the dew point sensor 106 to the interior 34 of the load lock chamber 46 when the sensing valve 303 fluidly separates the dew point sensor 106 from the interior 34 of the load lock chamber 46.

In the illustrated example, change in fluid coupling of the dew point sensor 106 between the load lock 14 and the dry gas source 134 is accomplished passively, i.e., without an actuator, responsive to cyclic ventilation and evacuation of the load lock 14. In this respect it is contemplated that the sensing valve 303 include a sensing valve body 306, a sensing valve member 308, and a sensing valve biasing member 310. The sensing valve body 306 has a sensing valve inlet port 313, a sensing valve outlet port 314 opposite the sensing valve inlet port 313, and a sensing valve seat 316 located between the sensing valve inlet port 313 and the sensing valve outlet port 314. The sensing valve member 308 is supported for movement within the sensing valve body 306 between a sensing valve member open position 318 wherein the sensing valve member 308 is spaced apart from the sensing valve seat 316 and a sensing valve member closed position 320 wherein the sensing valve member 308 abuts the sensing valve seat 316.

The sensing valve biasing member 310 is arranged between the between sensing valve member 308 and the sensing valve body 306, exerts a sensing valve member biasing force 324 on the sensing valve member 308 urging the sensing valve member 308 toward the sensing valve member closed position 320, and has a sensing valve biasing member coefficient 322. The sensing valve biasing member coefficient 322 is selected such that the sensing valve member biasing force 324 exerted on the sensing valve member 308 is both below force exerted on the sensing valve member 308 the purge/vent gas 68 admitted to the load lock 14 during purging/venting and above force exerted on the sensing valve member 308 when the load lock 14 is evacuated. As will be appreciated by those of skill in the art in view of the present disclosure, such sizing causes admission of the purge/vent gas 68 into the load lock 14 to move the sensing valve member 308 to the sensing valve member open position 318, a portion of the purge/vent gas 68 thereby communicated to the dew point sensor 106, and the dew point sensor 106 thereby acquiring measurements of dew point within the interior 34 of the load lock chamber 46. As will also be appreciated by those of skill in the art in view of the present disclosure, such sizing also causes the sensing valve member 308 to move the sensing valve member closed position 320 upon evacuation of the load lock 14. Such operable association of the sensing valve 302 with the load lock 14 simplifies the arrangement of the dew point sensor arrangement 300, for example, by reducing the need for software to operate the sensing valve 302 and associated validation of the software.

The drying valve 304 is similar to the sensing valve 302 and includes a drying valve body 326, a drying valve member 328, and a drying valve biasing member 330. The drying valve body 326 has a drying valve inlet port 332, a drying valve outlet port 334 located on a side of the drying valve body 326 opposite the drying valve inlet port 332, and a drying valve seat 336 located within the drying valve body 326 between the drying valve inlet port 332 and the drying valve outlet port 334. The drying valve member 328 is supported for movement within the drying valve body 326 between a drying valve member open position 338 wherein the drying valve member 328 spaced apart from the drying valve seat 336, and a drying valve member closed position 340 wherein the drying valve member 328 abuts the drying valve seat 336.

The drying valve biasing member 330 is arranged within the drying valve body 326 between the between drying valve member 328 and the drying valve body 326, couples the drying valve member 328 to the drying valve body 326, and is configured to exert a drying valve member biasing force 344 on the drying valve member 328. In this respect the drying valve biasing member 330 has a drying valve biasing member coefficient 342 that is greater than the sensing valve biasing member coefficient 322 to drive the drying valve member 328 to the drying valve member closed position 340 when the sensing valve member 308 moves to the sensing valve member open position 318 while allowing force associated with the dry gas 136 to drive the drying valve member 328 to the drying valve member open position 338 when the sensing valve member 308 moves to the sensing valve member closed position 320. Such operable association of the drying valve 304 with the sensing valve 302 also simplifies the arrangement of the dew point sensor arrangement 300, for example, by reducing the need for software to operate the drying valve 304 and associated validation of the software As will be appreciated by those of skill in the art in view of the present disclosure, driving the drying valve member 328 to the drying valve member closed position 340 when the sensing valve member 308 moves to the sensing valve member open position 318 prevents the dry gas 136 from influencing dew point measurements acquired by the dew point sensor 106 when the load lock 14 is fluidly coupled to the purge/vent gas source 54. As will also be appreciated by those of skill in the art in view of the present disclosure, driving the drying valve member 328 to the drying valve member open position 338 when the sensing valve member 308 moves to the sensing valve member closed position 320 allows the dry gas 136 to flow across the dew point sensor 106, improving accuracy of the dew point measurements acquired by the dew point sensor 106 during subsequent purging/evacuation of the load lock 14 by drying the dew point sensor 106.

Figure 10:
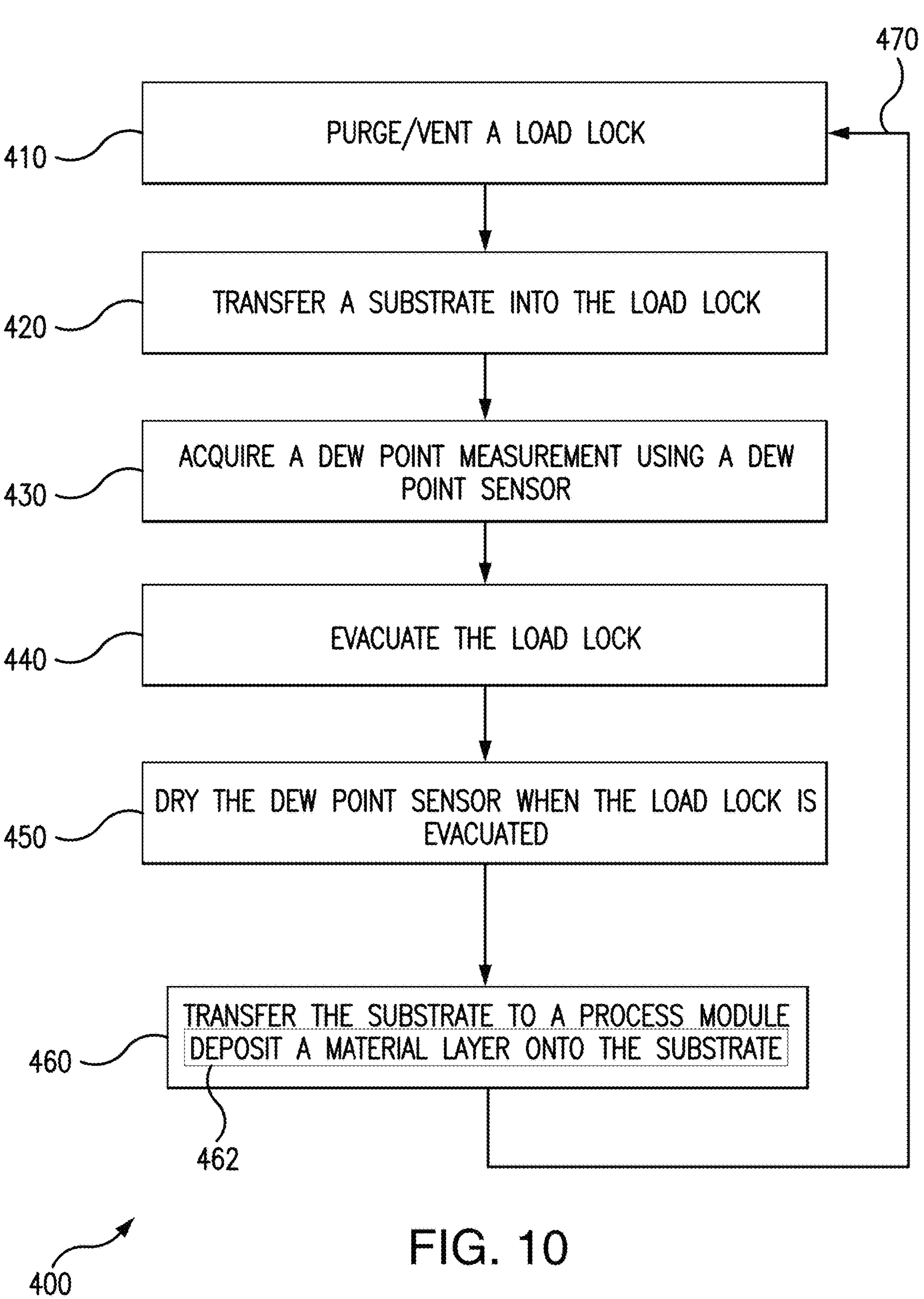
Figure 11:
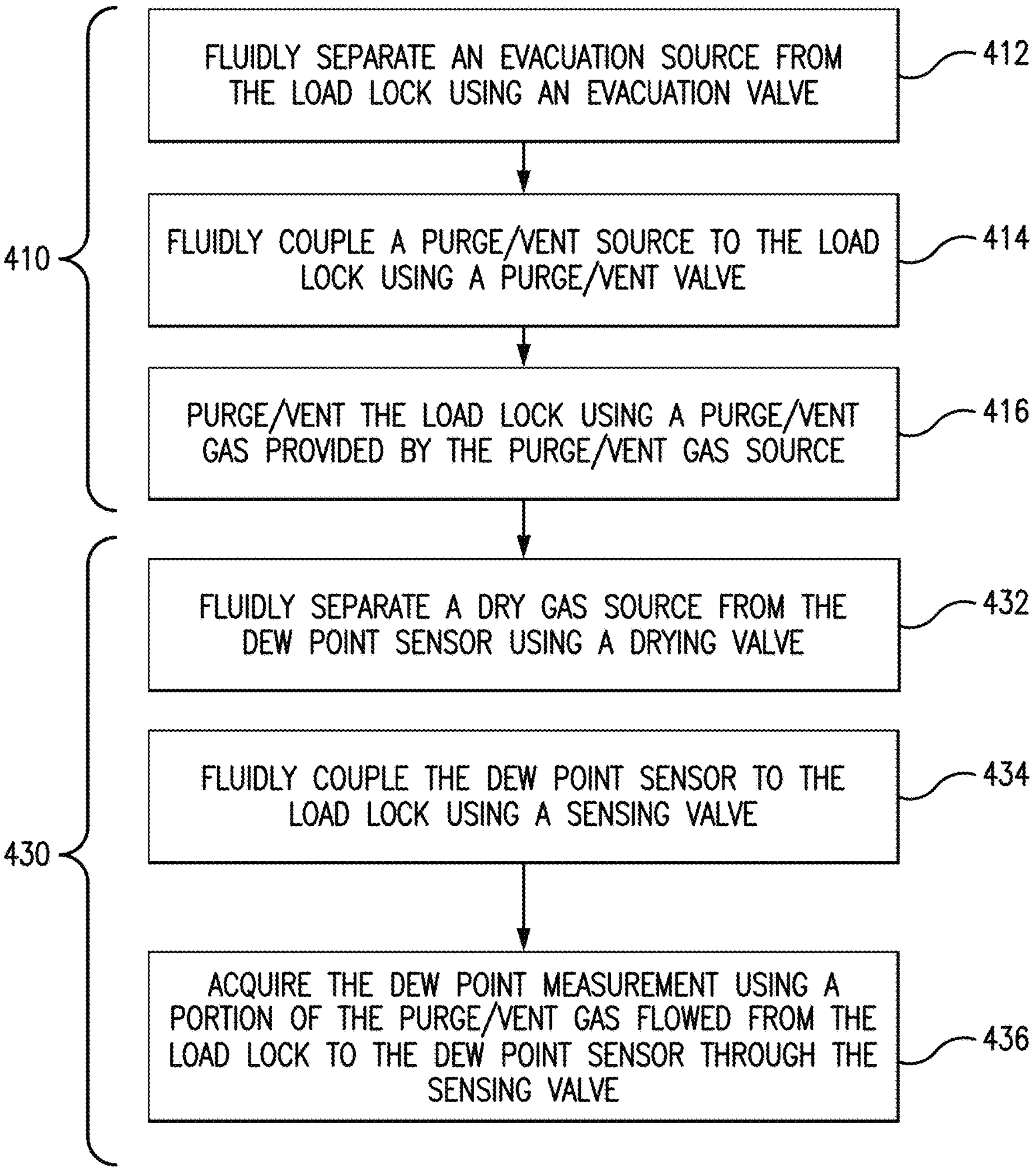
Figure 12:
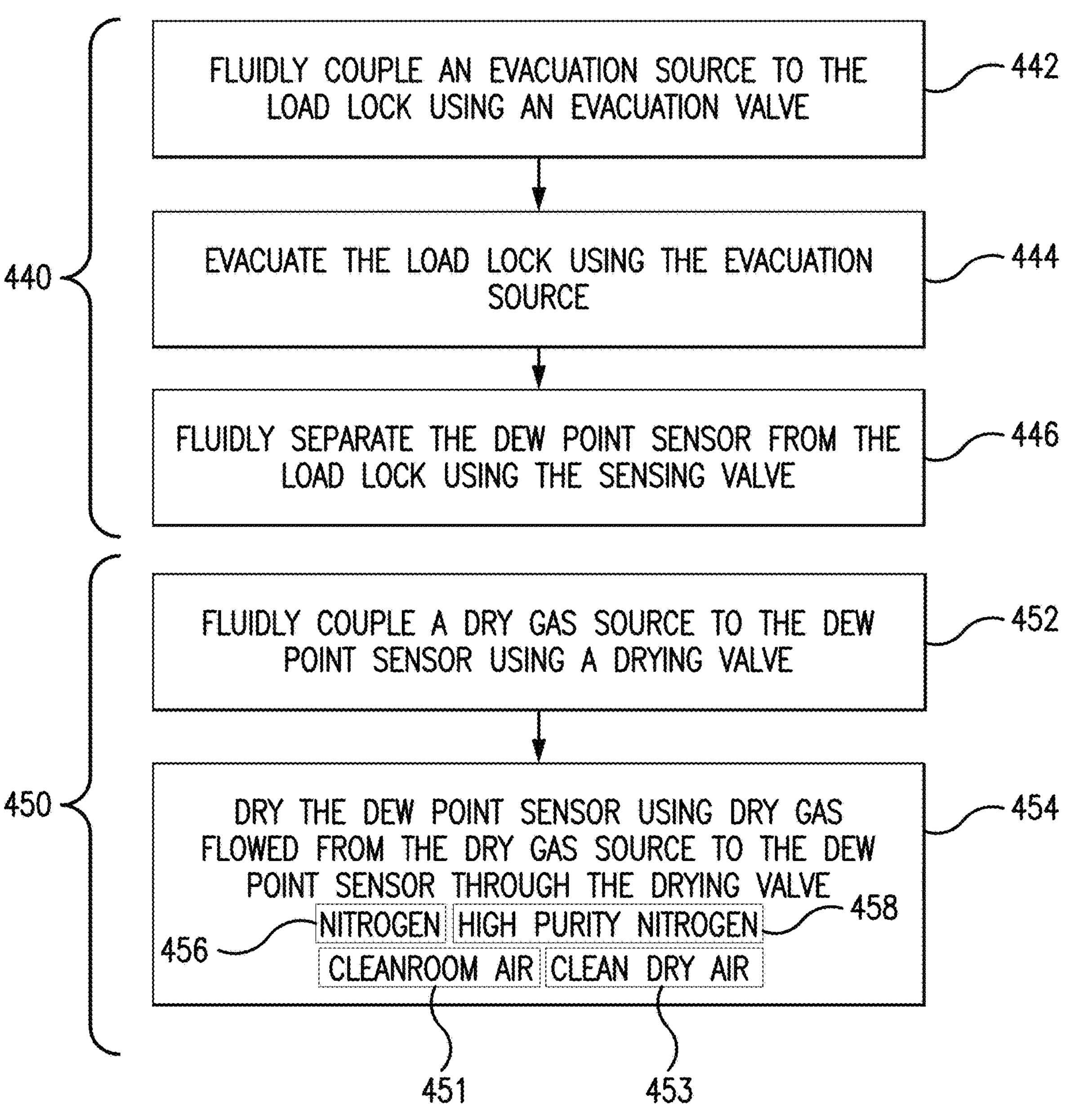

With reference to FIGS. 10-12, the dew point sensing method 400 is shown. Referring to FIG. 10, the dew point sensing method includes purge/venting a load lock, e.g., the load lock 14 (shown in FIG. 1), as shown with box 410. An unprocessed substrate, e.g., the substrate 2 (shown in FIG. 1), is then transferred into the load lock and the load lock evacuated, as shown with box 420 and box 440. Once the load lock has been evacuated the substrate is transferred to a process module, e.g., the process module 18 (shown in FIG. 1), for processing, as shown with box 460. In certain examples the substrate may be processed by depositing a material layer onto the substrate, e.g., the material layer 4 (shown in FIG. 1), as shown with box 462. The processed substrate is thereafter returned to load, the load lock purged/vented, and another unprocessed substrate transferred into the load lock, as shown with arrow 470. It is contemplated that dew point measurements be acquired from the load lock using a dew point sensor, e.g., the dew point sensor 106 (shown in FIG. 3), as shown with box 420. It is also contemplated that the dew point sensor be dried while the load lock is evacuated, as shown with box 450. As has been explained above, drying the dew point sensor while the load lock chamber is evacuated improves accuracy of dew point measurements acquired by the dew point sensor while the load lock chamber is under purge/vent by limiting concentration of moisture to which the dew point sensor is exposed during the cyclic evacuation and purging/venting of the load lock.

Referring to FIG. 11, purging/venting 410 the load lock may include fluidly separating an evacuation source, e.g., the evacuation source 50 (shown in FIG. 2), from the load lock, as shown with box 412. Fluid separation of the evacuation source from the load lock may be accomplished using an evacuation valve coupling the evacuation source to the load lock, e.g., the evacuation valve 52 (shown in FIG. 2), as also shown with box 412. Purging/venting 410 the load lock may include fluidly coupling a purge/vent source to the load lock, e.g., the purge/vent gas source 54 (shown in FIG. 2), as shown with box 414. The purge/vent gas source may be fluidly coupled to the load lock using a purge/vent valve coupling the purge/vent gas source to the load lock, e.g., the purge/vent valve 56 (shown in FIG. 2), as also shown with box 414. It is contemplated that purging/venting the load lock be accomplished by flowing a purge/vent gas provided by the purge/vent gas source to the load lock, e.g., the purge/vent gas 68 (shown in FIG. 2), as shown with box 416.

With continuing reference to FIG. 10, transferring 420 the substrate into the load lock may include opening a front-end gate valve, e.g., the front-end gate valve 28 (shown in FIG. 1). Once the front-end gate valve is opened, the substrate may be transferred into the load lock using a front-end substrate transfer robot supported within an atmospheric enclosure, e.g., the front-end substrate transfer robot 26 (shown in FIG. 1) supported within the enclosure 24. As will be appreciated by those of skill in the art in view of the present disclosure, opening the front-end gate valve may allow moisture resident within the atmospheric enclosure and/or carried by the substrate to infiltrate the load lock. As will also be appreciated by those of skill in the art in view of the present disclosure, improvement to the accuracy of dew point measurement acquired by the dew point sensor as described above allow countermeasures to be taken sooner (e.g., at lower reported dew point measurements), limiting risk that infiltrating moisture infiltrate the transfer chamber 36 during transfer of substrates into the back-end module 16 (shown in FIG. 1). For example, flow of the purge/vent gas provided to the load lock may be throttled (increased) at a lower dew point threshold than previously possible due to the increased accuracy of the dew point sensor arrangements described in the present disclosure.

Referring again to FIG. 11, it is contemplated that acquiring 430 the dew point measurement include fluidly separating a dry gas source form the dew point sensor, e.g., the dry gas source 124 (shown in FIG. 3), as shown with box 432. Fluid separation of the dry gas source from the dew point sensor may be accomplished using a drying valve, e.g., the drying valve 104 (shown in FIG. 3), as also shown with box 432. It is contemplated that acquiring 430 the dew point measurement include fluidly coupling the dew point sensor to the load using a sensing valve, e.g., the sensing valve 102 (shown in FIG. 2), as shown with box 434. Once the dew point sensor is fluidly coupled to the load lock by the sensing valve, a portion of the purge/vent gas resident within the load lock (and entrained moisture), e.g., the sensing gas 130 (shown in FIG. 4), is flowed from the load lock to the dew point sensor through the sensing valve, as shown with box 436. In certain examples flowing may be accomplished by drawing the sensed gas as an exhaust through the sensing valve and the dew point sensor using an exhaust source, e.g., the exhaust source 120 (shown in FIG. 3), as also shown with box 436.

Referring to FIG. 12, evacuating 440 the load lock may include fluidly coupling an evacuation source to the load lock, e.g., the evacuation source 50 (shown in FIG. 2), as shown with box 442. Fluid coupling of the evacuation source to the load lock may be accomplished using an evacuation valve, e.g., the evacuation valve 52 (shown n FIG. 2), as also shown with box 442. Once fluidly coupled to the load lock, it is contemplated that the evacuation source evacuate the load lock, for example, using a roughing pump and a booster pump, as shown with box 444. It is contemplated that the dew point sensor be fluidly separated from the load lock during at least a portion of the evacuation process, as shown with box 446. Fluid separation may be accomplished by closing the sensing valve coupling the dew point sensor to the load, as also shown with box 446. In certain examples, the dew point sensor may be fluidly separated from the load lock once the load lock reaches a predetermined evacuation pressure, or prior to a start of boosting phase of the evacuation operation, or even prior to a roughing phase of the evacuation process, as further shown by box 446. Advantageously, fluidly separating the dew point sensor from the load lock chamber prior to the roughing phase of the evacuation avoids exposing the dew point sensor to spikes in moisture potentially associated with evacuation of the load lock chamber, such as when adsorbed moisture issues from the surface of the substrate and/or structures within the load in response to decrease in pressure within the load lock.

It is contemplated that drying 450 the dew point sensor include fluidly coupling the dry gas source to the dew point sensor, as shown with box 452. Fluid coupling the dew point sensor to the dew point sensor may be accomplished, for example, using the drying valve, as also shown with box 452. Once the dry gas source is fluidly coupled to the dew point sensor, the dry gas source provides the dry gas to the drying valve, as shown with box 454. The drying valve in turn flows the dry gas to the dew point sensor, as also shown with box 454. In certain examples the dry gas may include (e.g., consist of or consist essentially of) nitrogen, as shown with box 456. In accordance with certain examples, the dry gas may include (e.g., consist of or consist essentially of) HPN, as shown with box 458. It is also contemplated that the dry gas may include cleanroom air or CDA, as shown with box 451 and box 453. Advantageously, in examples where the dry gas includes nitrogen or HPN, drawing the exhaust flow across the dew point sensor using the exhaust source may limit mass flow of the nitrogen or HPM employed to dry the dew point sensor, limiting cost of ownership of examples of dew point sensor arrangements described herein.

Figure 13:
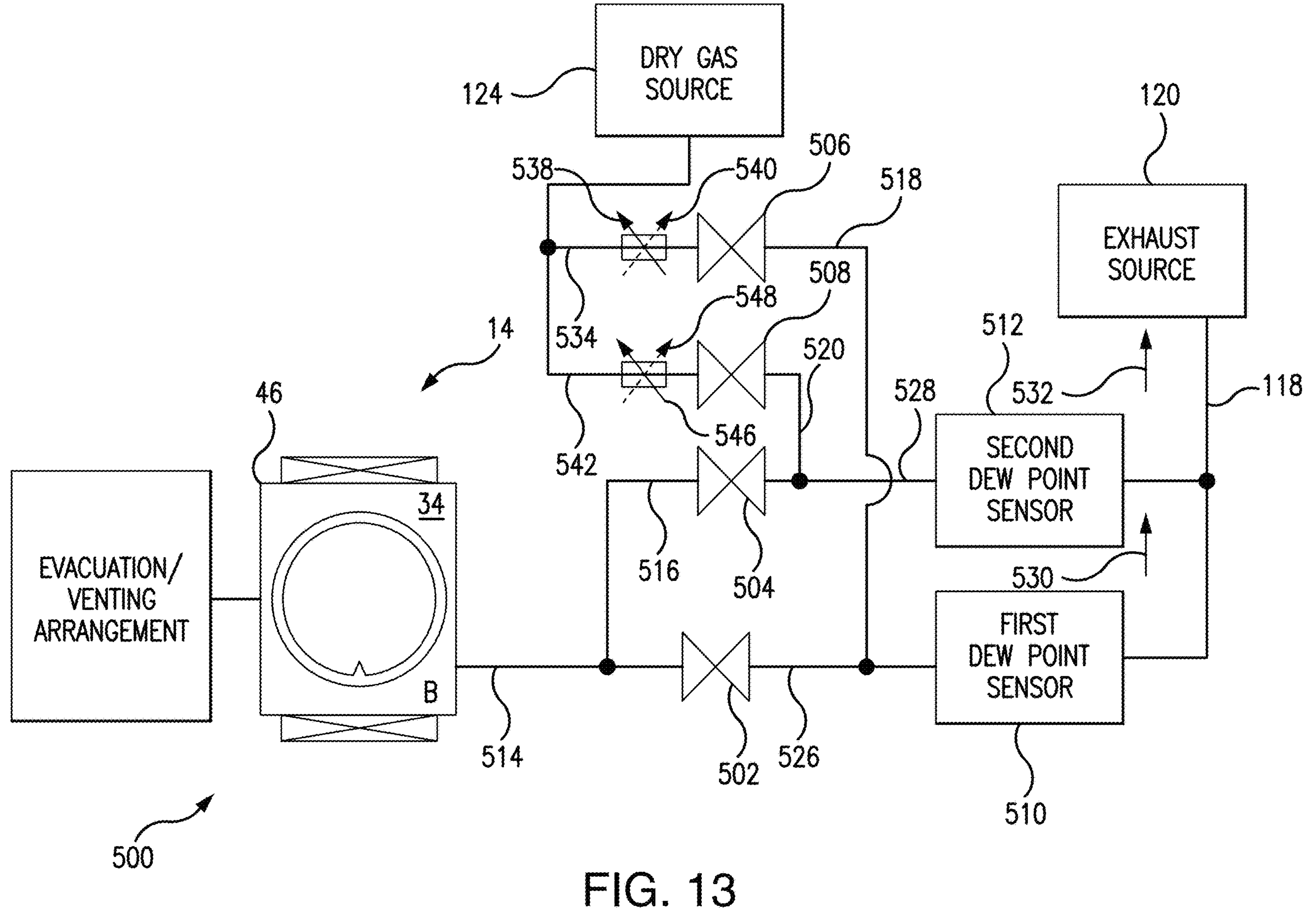

With reference to FIGS. 13-15 and FIG. 16, a dew point sensor arrangement 500 and a dew point sensing method 600, respectively, are shown. As shown in FIG. 13, the dew point sensor arrangement 500 is similar to the dew point sensor arrangement 100 (shown in FIG. 1) and additionally includes a first sensing valve 502, a second sensing valve 504, a first drying valve 506, and a second drying valve 508. The dew point sensor arrangement 500 also includes a first dew point sensor 510, a second dew point sensor 512, a first sensing conduit 514, and a second sensing conduit 516. The dew point sensor arrangement 500 additionally includes a first dry gas supply conduit 518, a second dry gas supply conduit 520, an optional first dry gas mass flow controller (MFC) 522, and an optional second dry gas MFC 524. As will be appreciated by those of skill in the art in view of the present disclosure, the dew point sensor arrangement 500 may include other elements or omit elements shown and described herein and remain within the scope of the present disclosure.

The first sensing valve 502 is similar to the sensing valve 102 (shown in FIG. 3), is additionally connected to the load lock chamber 46 by the first sensing conduit 514, and is further coupled to the first dew point sensor 510 by a first interconnect conduit 526. The first sensing valve 502 may further be operatively associated with a controller, e.g., the controller 212 (shown in FIG. 6), to selectively provide fluid communication between the load lock chamber 46 and the first dew point sensor 510. The second sensing valve 504 is similar to the first sensing valve 502, is additionally connected to the load lock chamber 46 by the second sensing conduit 516, and is further connected to the second dew point sensor 512 by a second interconnect conduit 528. The first dew point sensor 510 and the second dew point sensor 512 are both similar to the dew point sensor 106 (shown in FIG. 3) and are additionally each connected to the exhaust source 120 by the exhaust conduit 118. It is contemplated that the first dew point sensor 510 and the second dew point sensor 512 both be disposed in communication with a controller, e.g., the controller 212, and configured to communicate a first dew point measurement 530 and a second dew point measurement 532 to the controller acquired by the first dew point sensor 510 and the second dew point sensor 512, respectively, in cooperation with the first sensing valve 502, the second sensing valve 504, the first drying valve 506, and the second drying valve 508.

The first drying valve 506 is connected to the dry gas source 124 by a first dry gas source conduit 534, is further connected to the first dew point sensor 510 by the first dry gas supply conduit 518, and is further configured to provide selective fluid communication between the dry gas source 124 and the first dew point sensor 510. In this respect it is contemplated that the first drying valve 506 have a first position (shown with infill in FIG. 15), wherein the first drying valve 506 fluidly separates the dry gas source 124 from the first dew point sensor 510 from the dry gas source 124, and a second position (shown without infill in FIG. 14), wherein the first drying valve 506 fluidly couples the dry gas source 124 to the first dew point sensor 510. The first drying valve 506 may further be operatively associated with a controller, e.g., the controller 212 (shown in FIG. 6), to provide selective fluid communication between the dry gas source 124 and the first dew point sensor 510. In certain examples, the first dry gas MFC 522 may be arranged along the first dry gas source conduit 534 to throttle flow of a first dry gas flow 536 (shown in FIG. 14) to the first dew point sensor 510, for example, using a predetermined first low flow rate 538 and a first high flow rate 540 provided by the controller 212.

The second drying valve 508 is similar to the first drying valve 506 and is additionally connected to the dry gas source 124 by a second dry gas source conduit 542. The second drying valve 508 is further connected to the second dew point sensor 512 by the second dry gas supply conduit 520 and is further configured to provide selective fluid communication between the dry gas source 124 and the second dew point sensor 512 for communication of a second dry gas flow 544 (shown in FIG. 14) to the second dew point sensor 512 independent of the first dry gas flow 536 (shown in FIG. 14) communicated to the first dew point sensor 510. In this respect it is contemplated that the second drying valve 508 also have a first position (shown with infill in FIG. 15), wherein the second drying valve 508 fluidly separates the dry gas source 124 from the second dew point sensor 512, and a second position (shown without infill in FIG. 14), wherein the second drying valve 508 fluidly couples the dry gas source 124 to the second dew point sensor 512. It is also contemplated that the second drying valve 508 be operatively associated with a controller, e.g., the controller 212 (shown in FIG. 6), to provide selective fluid communication between the dry gas source 124 and the second dew point sensor 512. In certain examples, the second dry gas MFC 524 may be arranged along the second dry gas source conduit 542 to throttle flow of the second dry gas flow 545 to the second dew point sensor 512, for example, using a predetermined second low flow rate 546 and a second high flow rate 548 provided by the controller 212.

Figure 14:
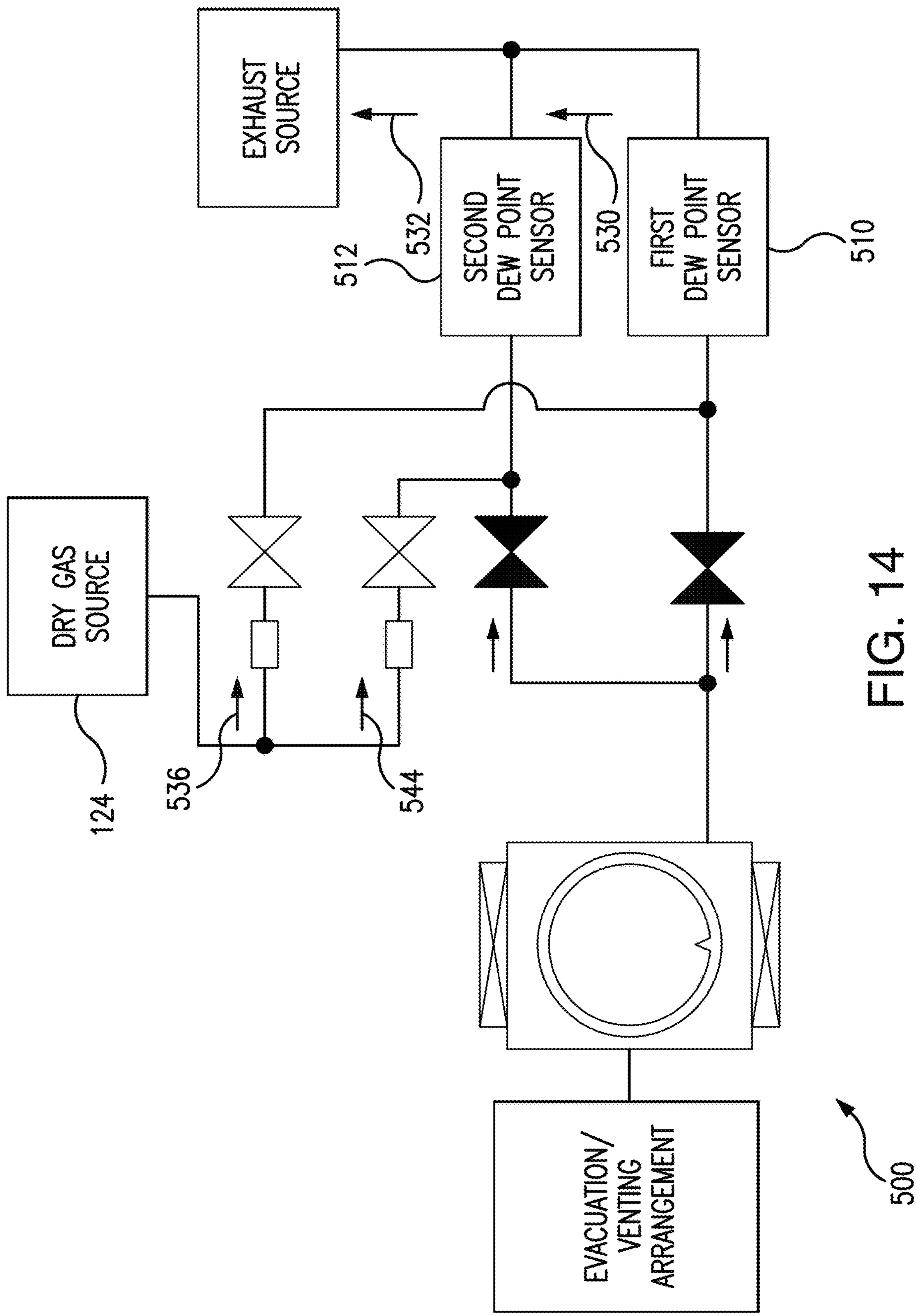

As shown in FIG. 14, the second dew point sensor 512 may be employed to monitor operation the first dew point sensor 510 using the dry gas flows. For example, the second dew point sensor 512 may receive the second dry gas flow 544 from the dry gas source 124 during selected intervals (or all intervals) when the first dew point sensor 510 receives the first dry gas flow 536 from the dry gas source 124. The first dew point measurement 530 acquired by the first dew point sensor 510 may compared to the second dew point measurement 532 acquired by the second dew point sensor 512 and an output (e.g., an alarm) provided to the user interface 248 (shown in FIG. 6) when the comparison indicates that the first dew point measurement differs from that of the second dew point measurement by more than a predetermined value. Alternatively (or additionally), the second dew point sensor 512 may be periodically fluidly coupled to the interior 34 of the load lock chamber 46 during an intervals where the first dew point sensor 510 is also fluidly coupled to the interior 34 of the load lock chamber 46. The first dew point measurement 530 acquired by the first dew point sensor 510 from sensing gas communicated from the interior 34 of the load lock chamber 46 to the first dew point sensor 510 may be compared to a second dew point measurement acquired by the second dew point sensor 512 from sensing gas communicated from the interior 34 of the load lock chamber 46 to the second dew point sensor 512, and an output provided to the user interface 248 when the comparison indicates that the first dew point measurement differs from that of the second dew point measurement by more than the predetermined value.

Figure 15:
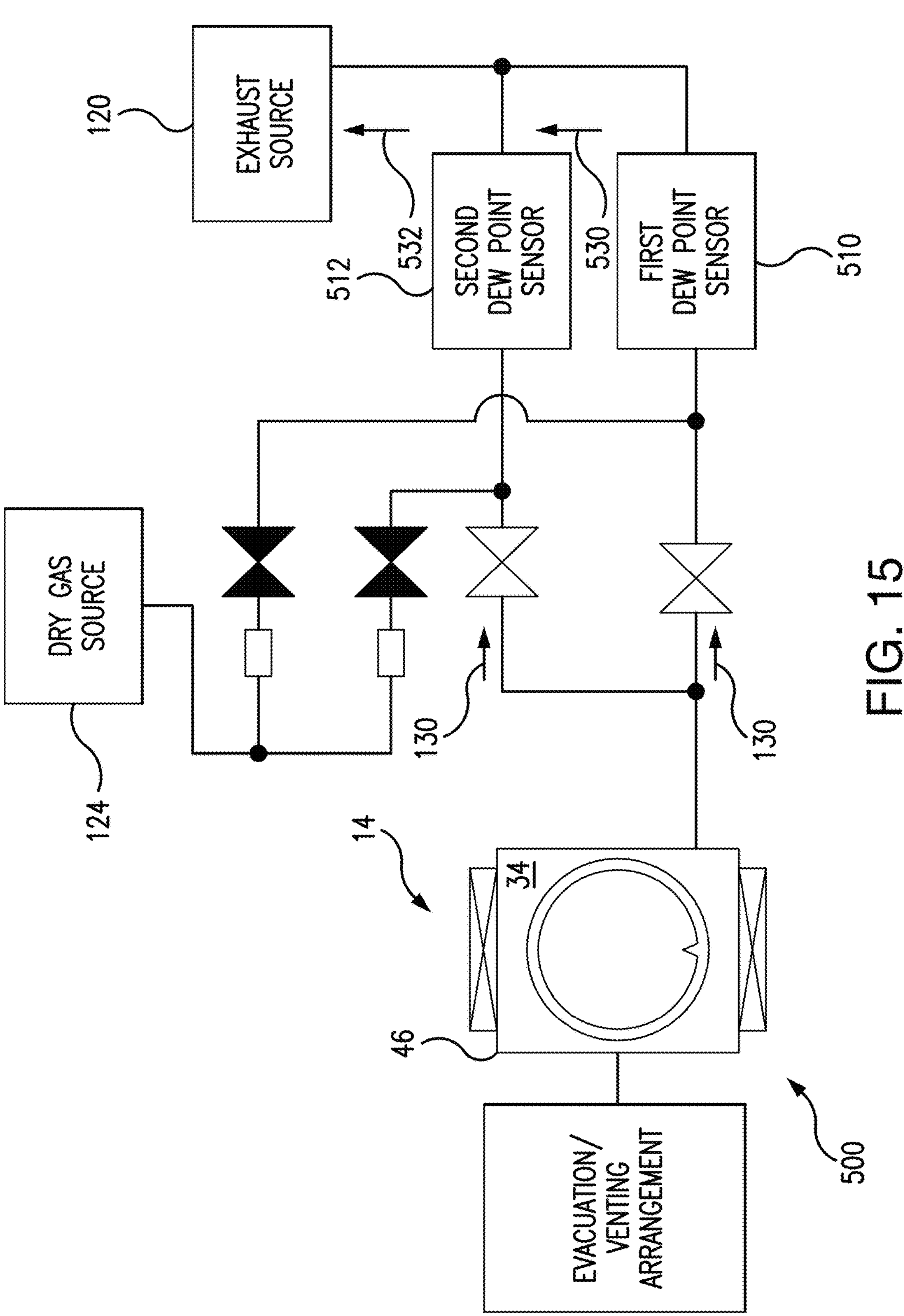

As shown in FIG. 15, the dew point sensor arrangement 500 may be configured to monitor operation of the first dew point sensor 510 with the second dew point sensor 512 using the sensing gas flow 130. For example, the second dew point sensor 512 may be fluidly coupled in parallel with the first dew point sensor 510 between the load lock chamber 46 and the exhaust source 120, the first dew point measurement 530 acquired by the first dew point sensor 510 compared to the second dew point measurement 532 acquired by the second dew point sensor 512 acquired from dry gas flows traversing the first dew point sensor 510 and the second dew point sensor 512, respectively. As will be appreciated by those of skill in the art in view of the present disclosure, this can alert a user operator of excessive drift in dew point measurements acquired by the first dew point sensor 510 during the service life of the first dew point sensor 510, limiting cost of the semiconductor processing system 10 (shown in FIG. 1) by limiting the need troubleshoot the first dew point sensor 510 when drift is detected dew point measurements acquired by the first dew point sensor 510.

Figure 16:
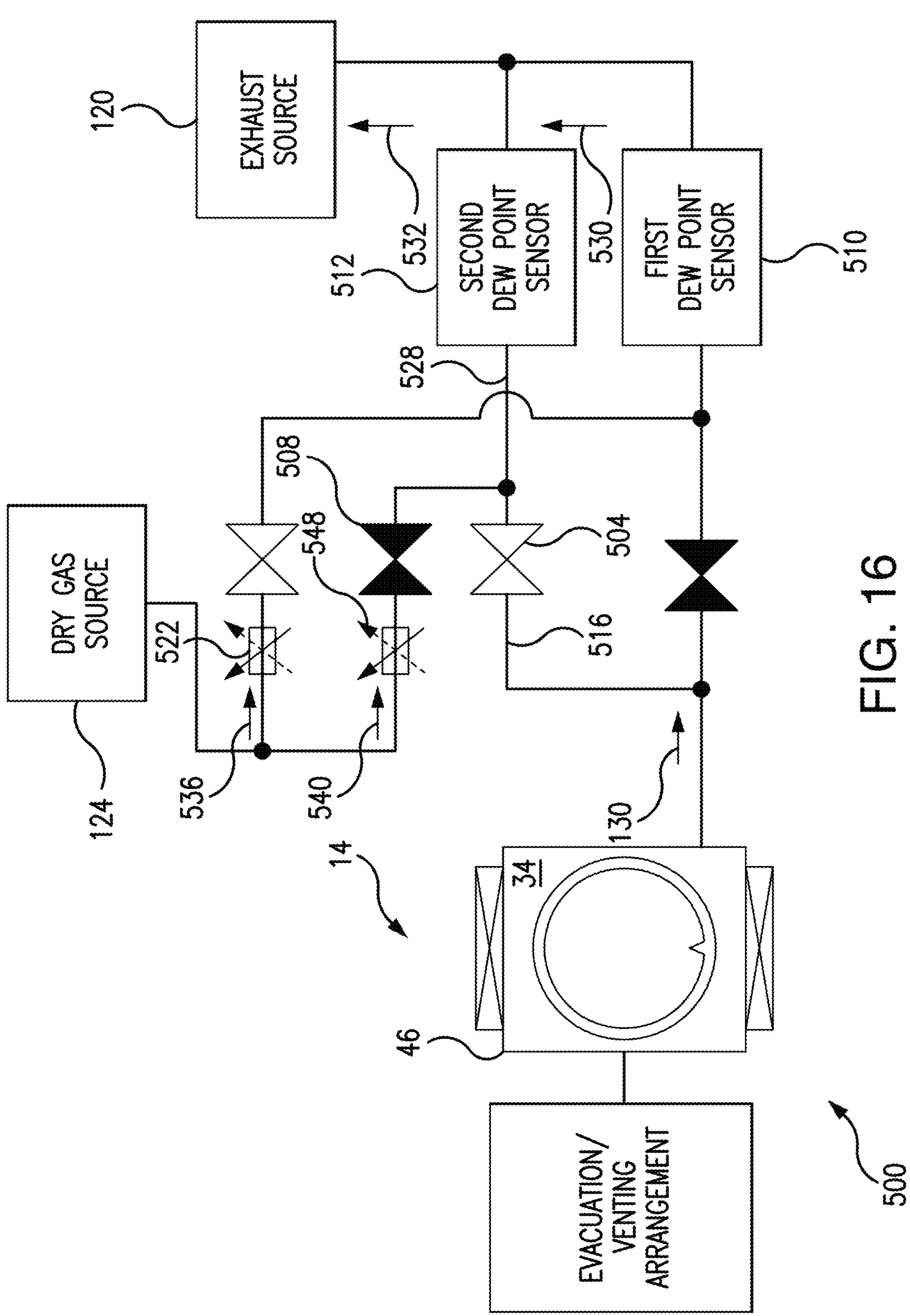

As shown in FIG. 16, one of the first dew point sensor 510 and the second dew point sensor 512 may be employed to calibrate the other of the first dew point sensor 510 and the second dew point sensor 512. In this respect the second dew point sensor 512 may be fluidly coupled in parallel with the first dew point sensor 510 between the interior 34 of the load lock chamber 46 and the exhaust source 120, the first dew point measurement 530 acquired by the first dew point sensor 510 compared to the second dew point measurement 532 acquired by the second dew point sensor 512 from sensing gas flows traversing both the first dew point sensor 510 and the second dew point sensor 512, and the differential written into one of the plurality of program modules 252 (shown in FIG. 6) recorded on the memory 250 (shown in FIG. 6) when the differential exceeds the predetermined differential. As will be appreciated by those of skill in the art in view of the present disclosure, this can also limit cost of ownership of the semiconductor processing system 10 (shown in FIG. 1), for example, by limiting (or eliminating) the need to calibrate either (or both) the first dew point sensor 510 and the second dew point sensor 512 during a cyclic maintenance event.

In certain examples, the dew point sensor arrangement 500 may be configured to monitor the interior 34 of the load lock chamber 46 with the second dew point sensor 512 in place of the first dew point sensor 510. In this respect, when the aforementioned differential between the first dew point measurement acquired with the first dew point sensor 510 differs from the second dew point measurement acquired with the second dew point sensor 512 by more than the predetermined differential valve, dew point sensing may thereafter be accomplished using the second dew point sensor 512, the second sensing valve 504, and the second drying valve 508. As will be appreciated by those of skill in the art in view of the present disclosure, this can limit cost of ownership of the semiconductor processing system 10 (shown in FIG. 1), for example, by allowing the first dew point sensor 510 to be serviced in the event the first dew point sensor 510 becomes unreliable without taking the semiconductor processing system 10 out of production to address the unreliability. In accordance with certain examples, the need for service may be provided to a user through the user interface 248 (shown in FIG. 6). Alternatively (or additionally), the instructions recorded in one or more of the plurality of program modules 252 (shown in FIG. 6) recorded on the memory 250 (shown in FIG. 6) may reactively schedule the semiconductor processing system 10 for maintenance when the differential exceeds the predetermined differential. It is also contemplated that the instructions may prognostically schedule the semiconductor processing system 10 for maintenance as the differential approaches the predetermined differential value.

As also shown in FIG. 16, the dew point sensor arrangement 500 may be configured to repair (or recover) the one of the first dew point sensor 510 and the second dew point sensor 512 using the dry gas source 124 while monitoring of the interior 34 of the load lock chamber 46 using the other the first dew point sensor 510 and the second dew point sensor 512 continues. In this respect, responsive to the aforementioned differential between the first dew point measurement and the second dew point measurement exceeding the predetermined dew point differential, and dew point sensing may be switched from the first dew point sensor 510 to the second dew point sensor 512, and dry gas may thereafter be flowed through the first dew point sensor 510 until such time as differentials between dew point measurements acquired by the first dew point sensor 510 and dew point measurements acquired by the second dew point sensor 512 return to below the predetermined differential value due to sensor drying effected by the dry gas provided to the first dew point sensor 510. In accordance with certain examples, drying may be accelerated during such repair or recoveries, for example, by increasing dry gas flow by throttling dry gas flow through the first dry gas MFC 522 using the first high flow rate 540. As will be appreciated by those of skill in the art in view of the present disclosure, this enables the controller 212 (shown in FIG. 6) to recover the first dew point sensor 510 subsequent to moisture exposure driving the first dew point sensor 510 out of the range within which the first dew point sensor 510 provides linear response to moisture content within the sensing gas provided to the first dew point sensor 510, also limiting cost of ownership of the semiconductor processing system 10 by limiting the need to take the semiconductor processing system 10 out of production following maintenance events where the first dew point sensor 510 may be exposed to abnormally elevated levels of moisture.

Figure 17:
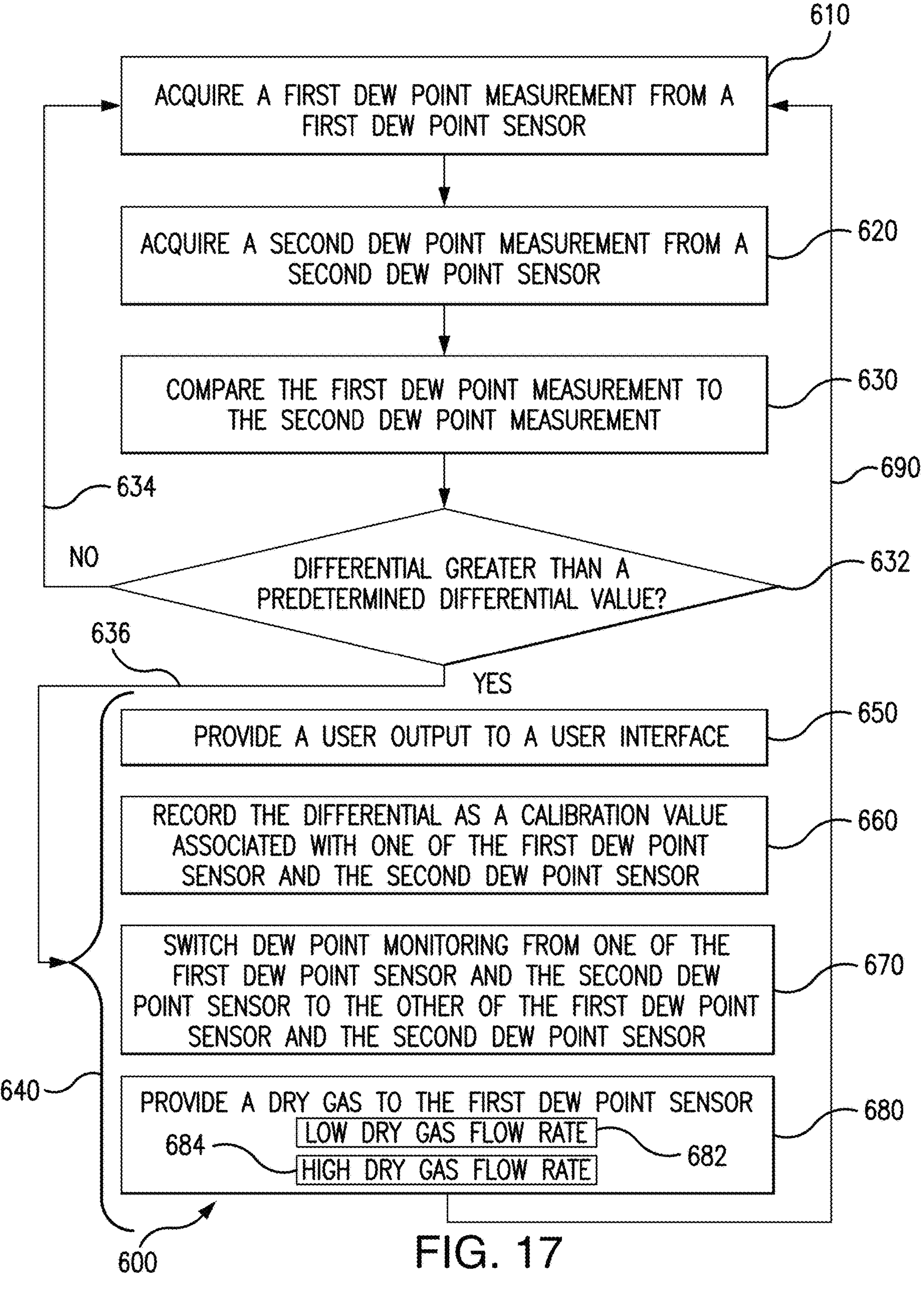

With reference to FIG. 17, the dew point sensing method 600 is shown. The dew point sensing method 600 includes acquiring a first dew point measurement from a first dew point sensor, e.g., the first dew point measurement 530 (shown in FIG. 13) from the first dew point sensor 510 (shown in FIG. 13), as shown with box 610. In certain examples, the first dew point measurement may be acquired using a dry gas provided to the first dew point sensor. In accordance with certain examples, the first dew point measurement may be acquired using a sensing gas provided to the first dew point sensor. The dew point sensing method 600 also includes acquiring a second dew point measurement from a second dew point sensor, e.g., the second dew point measurement 532 (shown in FIG. 13) from the second dew point sensor 512 (shown in FIG. 13), as show with box 620. In certain examples, the second dew point measurement may be acquired using a sensing gas provided to the second dew point sensor. In accordance with certain examples, the second dew point measurement may be acquired using a sensing gas provided to the second dew point sensor. The first dew point measurement is compared to the second dew point measurement, as shown with box 630, and dew point sensing may continue (e.g., cyclically) when a differential between the first dew point measurement and the second dew point measurement is less than a predetermined dew point measurement differential value, as shown with box 632 and arrow 634.

When the differential between the first dew point measurement and the second dew point measurement is greater than the predetermined differential the method 600 includes taking one or more countermeasures 640, as shown with box 632 and arrow 636. In this respect a user output, e.g., an alarm, may be provided to a user interface when the differential is greater than the predetermined differential, e.g., to the user interface 628 (shown in FIG. 6), as shown with box 650. Alternatively (or additionally), the differential may be recorded on a non-transitory machine-readable medium of a memory in one or more of a plurality of program modules as a calibration offset associated with one of the first dew point sensor and the second dew point sensor, as shown with box 660. Alternatively (or additionally), dew point sensing may be switched from one of the first dew point sensor and the second dew point sensor to the other of the first dew point sensor and the second dew point sensor, as shown with box 670. It is also contemplated that a dry gas may be provided to one of the first dew point sensor and the second dew point sensor when the differential between the first dew point measurement and the second dew point measurement is greater than the predetermined differential value, for example, subsequent to switching dew point monitoring to the other of the first dew point sensor and the second dew point sensor, as shown with box 680. In certain examples, the dry gas may be provided to the first dew point sensor at the low dry gas flow rate, for example, to slowly dry the first dew point sensor to return the dew point to a range within which the response of the first dew point sensor to moisture is linear, as shown with box 682. In accordance with certain examples, the dry gas may be provided to the first dew point sensor at the high dry gas flow rate, for example, to rapidly dry the first dew point sensor to return the dew point to a range within which response of the first dew point sensor to moisture is linear, as shown with box 684. As shown with arrow 690, sensing and countermeasure application may be iteratively, for example, when cyclic maintenance of a source of sensing gas introduces moisture into the source of sensing gas, e.g., when the load lock 14 (shown in FIG. 1) is periodically exposed to the atmosphere outside of the semiconductor processing system 10 (shown in FIG. 1) for cleaning or service.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

The invention claimed is:

1. A dew point sensor arrangement, comprising:

a sensing conduit and a dry gas source conduit coupled to a dew point sensor;

a sensing valve with a sensing valve member coupling the sensing conduit to the dew point sensor, the sensing valve member having a sensing valve member open position and a sensing valve member closed position;

a drying valve with a drying valve member coupling the dry gas source conduit to the dew point sensor, the drying valve member having a drying valve member open position and a drying valve member closed position;

a dry gas source connected to the dry gas source conduit and fluidly coupled through the dry gas source conduit to the drying valve;

a load lock connected to the sensing conduit; and a purge/vent valve coupled to the load lock, wherein the sensing valve member fluidly separates the sensing conduit from the dew point sensor in the sensing valve member closed position;

wherein the dry gas source conduit is fluidly coupled to the dew point sensor when the drying valve member is in the drying valve member open position; and wherein the drying valve member moves to the drying valve member open position when the sensing valve member moves to the sensing valve member closed position to dry the dew point sensor using a dry gas provided through the dry gas source conduit.

2. The dew point sensor arrangement of claim 1, wherein the sensing conduit is fluidly coupled to the dew point sensor by the sensing valve when the sensing valve member is in the sensing valve member open position.

3. The dew point sensor arrangement of claim 2, wherein the drying valve member fluidly separates the dry gas source conduit from the dew point sensor when the drying valve member is in the drying valve member closed position.

4. The dew point sensor arrangement of claim 3, wherein the drying valve member moves to the drying valve member closed position when the sensing valve member moves to the sensing valve member open position.

5. The dew point sensor arrangement of claim 1, further comprising:

an interconnect conduit coupling the dew point sensor to the sensing valve;

a tee fitting connected to the interconnect conduit; and a dry gas supply conduit connected to the tee fitting and coupling the drying valve to the interconnect conduit.

6. The dew point sensor arrangement of claim 1, further comprising:

an exhaust conduit connected to the dew point sensor; and an exhaust source connected to the exhaust conduit and fluidly coupled through the dew point sensor to the sensing valve and the drying valve.

7. The dew point sensor arrangement of claim 1, wherein the dry gas source comprises high purity nitrogen.

8. The dew point sensor arrangement of claim 1, wherein the dry gas source is coupled to the load lock to purge/vent the load lock using a dry gas provided by the dry gas source.

9. The dew point sensor arrangement of claim 1, further comprising a sensing valve solenoid connected to the sensing valve member and configured to move the sensing valve member between the sensing valve member open position and the sensing valve member closed position.

10. The dew point sensor arrangement of claim 9, further comprising a drying valve solenoid operably connected to the drying valve member and configured to move the drying valve member between the drying valve member open position and the drying valve member closed position.

11. The dew point sensor arrangement of claim 10, further comprising a controller responsive to instructions recorded on a non-transitory machine-readable medium to:

move the sensing valve member to the sensing valve member open position; and move the drying valve member to the drying valve member closed position when the sensing valve member moves to the sensing valve member open position.

12. The dew point sensor arrangement of claim 11, wherein the instructions recorded on the non-transitory machine-readable medium cause the controller to:

move the sensing valve member to the sensing valve member closed position; and move the drying valve member to the drying valve member open position when the sensing valve member moves to the sensing valve member closed position.

13. The dew point sensor arrangement of claim 1, wherein the sensing valve is a first sensing valve, the drying valve is a first drying valve, and the dew point sensor is a first dew point sensor, the dew point sensor arrangement further comprising:

a second sensing valve connected to the sensing conduit;

a second drying valve connected to the dry gas source conduit;

a second dew point sensor connected to the second sensing valve and the second drying valve;

an exhaust conduit coupled to the second sensing valve and the second drying valve through the second dew point sensor, wherein the exhaust conduit is coupled to the first sensing valve and the first drying valve through the first dew point sensor; and a controller disposed in communication with the first dew point sensor and the second dew point sensor and configured to at least one of:

(a) monitor operation of the first dew point sensor using the second dew point sensor, (b) calibrate one of the first dew point sensor and the second dew point sensor using a differential between a first dew point measurement acquired by the first dew point sensor and a second dew point measurement acquired by the second dew point sensor, (c) switch dew point sensing from one of the first dew point sensor and the second dew point sensor to the other of the first dew point sensor and the second dew point sensor using a differential between a first dew point measurement acquired by the first dew point sensor and a second dew point measurement acquired by the second dew point sensor, and (d) repair or recover one of the first dew point sensor and the second dew point sensor by providing a dry gas flow to the one of the first dew point sensor and the second dew point sensor.

14. A semiconductor processing system, comprising:

the load lock coupling a front-end module to a back-end module;

an evacuation valve coupling an evacuation source to the load lock;

a drying valve coupling the dry gas source to the load lock;

the dew point sensor arrangement as recited in claim 1, wherein the sensing valve is coupled by the sensing conduit to the load lock, the dew point sensor arrangement further comprising a controller responsive to instructions recorded on a memory to:

fluidly couple the evacuation source to the load lock using the evacuation valve;

fluidly separate the dew point sensor from the load lock using the sensing valve; and fluidly couple the dry gas source to the dew point sensor using the drying valve to dry the dew point sensor while the load lock is evacuated.

15. The semiconductor processing system of claim 14, wherein the drying valve is operably associated with the sensing valve, and wherein the sensing valve is operably associated with the load lock.

16. The semiconductor processing system of claim 14, wherein the sensing valve comprises a sensing valve solenoid connected to the sensing valve member and operably associated with the controller, and wherein the drying valve comprises a drying valve solenoid connected to the drying valve member and operably associated with the controller.

17. The semiconductor processing system of claim 14, further comprising a purge/vent gas source coupled to the load lock by the purge/vent valve, wherein the instructions further cause the controller to:

fluidly separate the evacuation source from the load lock using the evacuation valve;

fluidly couple the purge/vent gas source to the load lock using the purge/vent valve;

fluidly separate the dry gas source from the dew point sensor using the drying valve;

fluidly couple the dew point sensor to the load lock using the sensing valve; and acquire a dew point measurement from within the load lock with the dew point sensor using a portion of a purge/vent gas provided to the load lock by the purge/vent gas source.

18. A dew point sensor arrangement, comprising:

a sensing conduit and a dry gas source conduit coupled to a dew point sensor;

a sensing valve with a sensing valve member coupling the sensing conduit to the dew point sensor, the sensing valve member having a sensing valve member open position and a sensing valve member closed position; and a drying valve with a drying valve member coupling the dry gas source conduit to the dew point sensor, the drying valve member having a drying valve member open position and a drying valve member closed position, wherein the drying valve comprises a drying valve biasing member with a drying valve biasing member coefficient, wherein the sensing valve comprises a sensing valve biasing member with a sensing valve biasing member coefficient, and wherein the drying valve biasing member coefficient is greater than the sensing valve biasing member coefficient, wherein the sensing valve member fluidly separates the sensing conduit from the dew point sensor in the sensing valve member closed position, wherein the dry gas source conduit is fluidly coupled to the dew point sensor when the drying valve member is in the drying valve member open position, and wherein the drying valve member moves to the drying valve member open position when the sensing valve member moves to the sensing valve member closed position to dry the dew point sensor using a dry gas provided through the dry gas source conduit.

19. The dew point sensor arrangement of claim 18, further comprising a dry gas source connected to the dry gas source conduit and fluidly coupled through the dry gas source conduit to the drying valve.

20. A dew point sensing method, comprising:

at a dew point sensor arrangement including a sensing conduit and a dry gas source conduit coupled to a dew point sensor; a sensing valve with a sensing valve member coupling the sensing conduit to the dew point sensor, the sensing valve member having a sensing valve member open position and a sensing valve member closed position; a drying valve with a drying valve member coupling the dry gas source conduit to the dew point sensor, the drying valve member having a drying valve member open position and a drying valve member closed position; the sensing valve member fluidly separating the sensing conduit from the dew point sensor in the sensing valve member closed position, the drying valve fluidly coupling the dry gas source conduit to the dew point sensor when the drying valve member is in the drying valve member open position, fluidly coupling an evacuation source to a load lock in a semiconductor processing system;

fluidly separating the dew point sensor from the load lock using the sensing valve;

fluidly coupling a dry gas source to the dew point sensor using the drying valve;

flowing a dry gas to the dew point sensor through the drying valve;

drying the dew point sensor while the load lock is evacuated using a dry gas provided to the dew point sensor by the dry gas source; and wherein the drying valve member moves to the drying valve member open position when the sensing valve member moves to the sensing valve member closed position to dry the dew point sensor using the dry gas provided through the dry gas source conduit.

21. The method of claim 20, further comprising:

fluidly separating the evacuation source from the load lock;

fluidly coupling a purge/vent gas source to the load lock using a purge/vent valve;

fluidly separating the dry gas source from the dew point sensor using the drying valve;

fluidly coupling the dew point sensor to the load lock using the sensing valve; and acquiring a dew point measurement from within the load lock using a portion of a purge/vent gas provided to the load lock by the purge/vent gas source.

22. The method of claim 20, wherein the sensing valve is a first sensing valve, the drying valve is a first drying valve, and the dew point sensor is a first dew point sensor the method further comprising at least one of:

(a) monitoring operation of the first dew point sensor using a second dew point sensor;

(b) calibrating one of the first dew point sensor and the second dew point sensor using a differential between a first dew point measurement acquired by the first dew point sensor and a second dew point measurement acquired by the second dew point sensor;

(c) switching dew point sensing from one of the first dew point sensor and the second dew point sensor to the other of the first dew point sensor and the second dew point sensor using a differential between a first dew point measurement acquired by the first dew point sensor and a second dew point measurement acquired by the second dew point sensor; and (d) repairing or recovering one of the first dew point sensor and the second dew point sensor by providing a dry gas flow to the one of the first dew point sensor and the second dew point sensor.

* * * * *